United States Patent
Tseng et al.

(10) Patent No.: US 9,246,068 B2
(45) Date of Patent: Jan. 26, 2016

(54) METHOD AND APPARATUS FOR FABRICATING PHOSPHOR-COATED LED DIES

(71) Applicant: TSMC Solid State Lighting Ltd., Hsinchu (TW)

(72) Inventors: Chi-Xiang Tseng, Kaohsiung (TW); Hsiao-Wen Lee, Hsinchu (TW); Min-Sheng Wu, Taoyuan County (TW); Tien-Min Lin, Chiayi (TW)

(73) Assignee: TSMC SOLID STATE LIGHTING LTD., Hsinchu (TW)

( * ) Notice: Subject to any disclaimer, the term of this patent is extended or adjusted under 35 U.S.C. 154(b) by 0 days.

(21) Appl. No.: 14/305,092

(22) Filed: Jun. 16, 2014

(65) Prior Publication Data
US 2014/0295593 A1 Oct. 2, 2014

Related U.S. Application Data

(63) Continuation-in-part of application No. 13/788,536, filed on Mar. 7, 2013, now Pat. No. 8,889,439, and a continuation-in-part of application No. 13/594,219, filed on Aug. 24, 2012, now Pat. No. 8,765,500.

(51) Int. Cl.
*H01L 33/50* (2010.01)
*H01L 33/46* (2010.01)
*H01L 33/54* (2010.01)

(52) U.S. Cl.
CPC ............ *H01L 33/504* (2013.01); *H01L 33/505* (2013.01); *H01L 33/46* (2013.01); *H01L 33/508* (2013.01); *H01L 33/54* (2013.01); *H01L 2933/0041* (2013.01)

(58) Field of Classification Search
USPC .............. 438/22–47, 69, 493, 503, 507, 956; 257/13, 79–103, 918, 257/E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 7,816,463 B2 | 10/2010 | Zhan | |
| 2011/0084296 A1 | 4/2011 | Cheng | |
| 2013/0187178 A1 | 7/2013 | Tischler | |
| 2013/0200398 A1* | 8/2013 | Wang et al. | 257/88 |
| 2015/0076273 A1* | 3/2015 | Rudin et al. | 242/439.5 |

FOREIGN PATENT DOCUMENTS

KR   10-2011-0040694   4/2011

OTHER PUBLICATIONS

Office Action mailed Dec. 29, 2014 in Korean Patent Application No. 10-2013-0099044, 8 pages.

* cited by examiner

*Primary Examiner* — Mamadou Diallo
(74) *Attorney, Agent, or Firm* — Muncy, Geissler, Olds & Lowe P.C.

(57) ABSTRACT

The present disclosure involves a method. The method includes providing a substrate having a layer disposed thereon. A plurality of light-emitting devices is attached to the layer. A gel is applied over the substrate. The gel covers the plurality of light-emitting devices. The gel is shaped into a plurality of lenses. The lenses each cover a respective one of the light-emitting devices. The light-emitting devices are separated from one another. The substrate and the layer are removed.

20 Claims, 39 Drawing Sheets

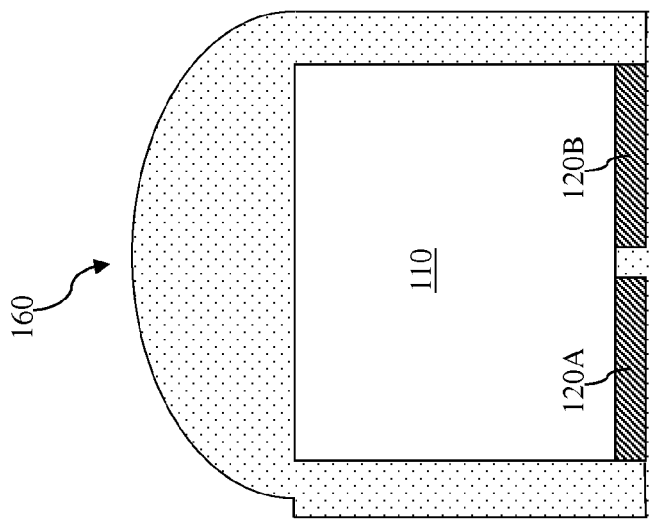
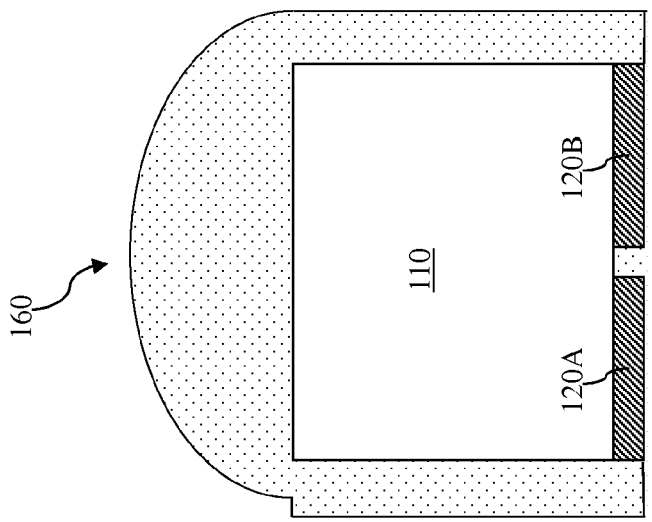
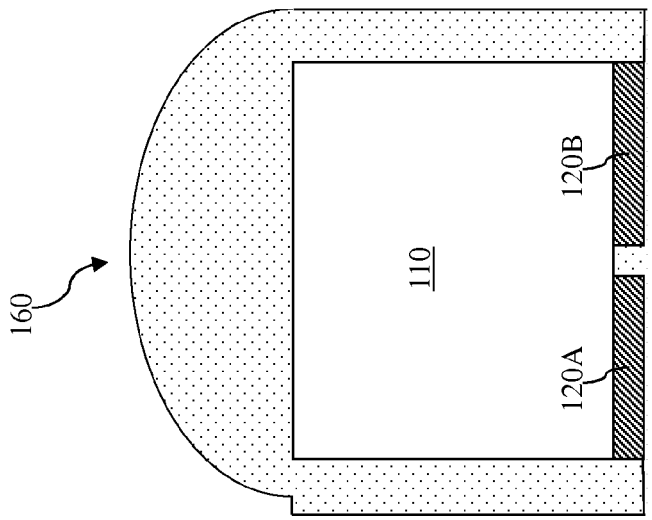
Fig. 18

METHOD AND APPARATUS FOR FABRICATING PHOSPHOR-COATED LED DIES

PRIORITY DATA

The present application is a continuation-in-part (CIP) application of U.S. patent application Ser. No. 13/788,536, filed on Mar. 7, 2013, entitled "Method and Apparatus for Packaging Phosphor-Coated LEDs" and a continuation-in-part (CIP) application of U.S. application Ser. No. 13/594,219, filed on Aug. 24, 2012, entitled "Method and Apparatus for Fabricating Phosphor-Coated LED Dies", the disclosures of each which are hereby incorporated by reference in their respective entireties.

TECHNICAL FIELD

The present disclosure relates generally to light-emitting devices, and more particularly, to the fabrication of phosphor-coated light-emitting diode (LED) dies.

BACKGROUND

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

To configure the color of the light output from an LED, a photoconversion material such as phosphor may be utilized to change the light output from one color to another. However, conventional methods and techniques of applying photoconversion materials to LEDs suffer from drawbacks such as low throughput and high cost. In addition, some conventional LED packaging processes involve using a carrier substrate for support. As an LED dicing process is performed to singulate the LEDs, the carrier substrate is also sliced. This results in the waste of the carrier substrate, as the sliced carrier substrate may not be used in fabrication again.

Therefore, although existing methods of applying photoconversion materials to LEDs have been generally adequate for their intended purposes, they have not been entirely satisfactory in every aspect. A cheaper and more efficient way of applying photoconversion materials to LEDs continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

FIGS. 9-15 and 17-18 are diagrammatic fragmentary cross-sectional side views of a plurality of LEDs undergoing a packaging process according to various aspects of the present disclosure.

DETAILED DESCRIPTION

Figure 1:
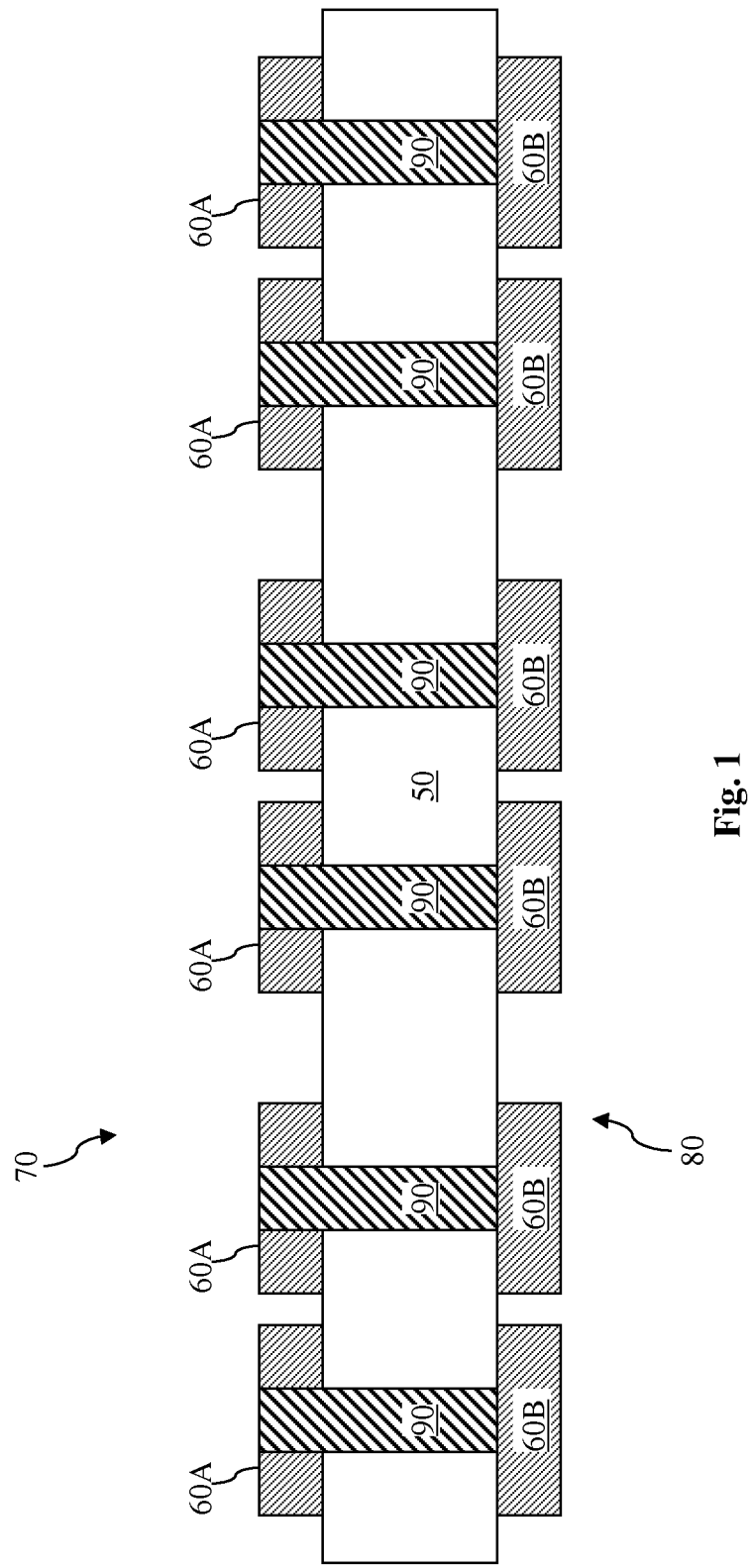
FIGS. 1-4 are diagrammatic fragmentary cross-sectional side views of a plurality of LEDs undergoing a packaging process according to some embodiments of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diodes (LEDs). When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

As light sources, LED dies or emitters may not naturally emit the color of light that is desirable for a lighting instrument. For example, many LED emitters naturally emit blue light. However, it is desirable for an LED-based lighting instrument to produce a light that is closer to a white light, so as to emulate the light output of traditional lamps. Therefore, photoconversion materials such as phosphor have been used to reconfigure the light output color from one to another. For example, a yellow phosphor material can change the blue light emitted by an LED die to a color close to white.

However, traditional methods of applying photoconversion materials on LED dies have certain drawbacks. For example, these traditional methods do not offer the capability of applying the photoconversion material to LEDs on a die level or a chip level. As such, the traditional methods of applying photoconversion materials on LED dies may be expensive and inefficient. In addition, in certain LED packaging processes, the phosphor material may be coated on a plurality of LEDs disposed over a carrier substrate. As a dicing process is performed to separate the LEDs from adjacent LEDs (i.e., singulation), the carrier substrate underneath is also diced. The diced carrier substrate may not be reusable again. Thus, conventional LED packaging processes may lead to waste and inefficiencies in fabrication.

According to various aspects of the present disclosure, described below is a method of applying a photoconversion material to LEDs on a die level or a chip level, which enhances throughput and reduces waste. Furthermore, a method of packaging phosphor-coated LEDs without wasting the carrier substrate is also disclosed.

In more detail, FIGS. 1-8 are simplified diagrammatic cross-sectional side views of a plurality of LEDs at various stages of packaging according to some embodiments of the present disclosure. Referring to FIG. 1, a submount 50 (also referred to as a substrate) is provided. In some embodiments, the submount 50 may be a silicon submount. In other embodiments, the submount 50 may be a ceramic submount or a printed circuit board (PCB). The submount 50 provides mechanical strength and support for the subsequent packaging processes.

A plurality of conductive pads 60 is disposed on both sides of the submount 50. For example, the conductive pads 60A are disposed on a front side 70 of the submount 50, and the conductive pads 60B are disposed on a back side 80 of the submount 50. The conductive pads 60A-60B are thermally and electrically conductive. In some embodiments, the conductive pads 60A-60B include metal, for example copper, aluminum, or another suitable metal.

Each pair of the conductive pads 60A-60B is interconnected by a respective via 90 that extends through the substrate 50. The via 90 contains a thermally and electrically conductive material as well, for example a suitable metal material.

Figure 2:
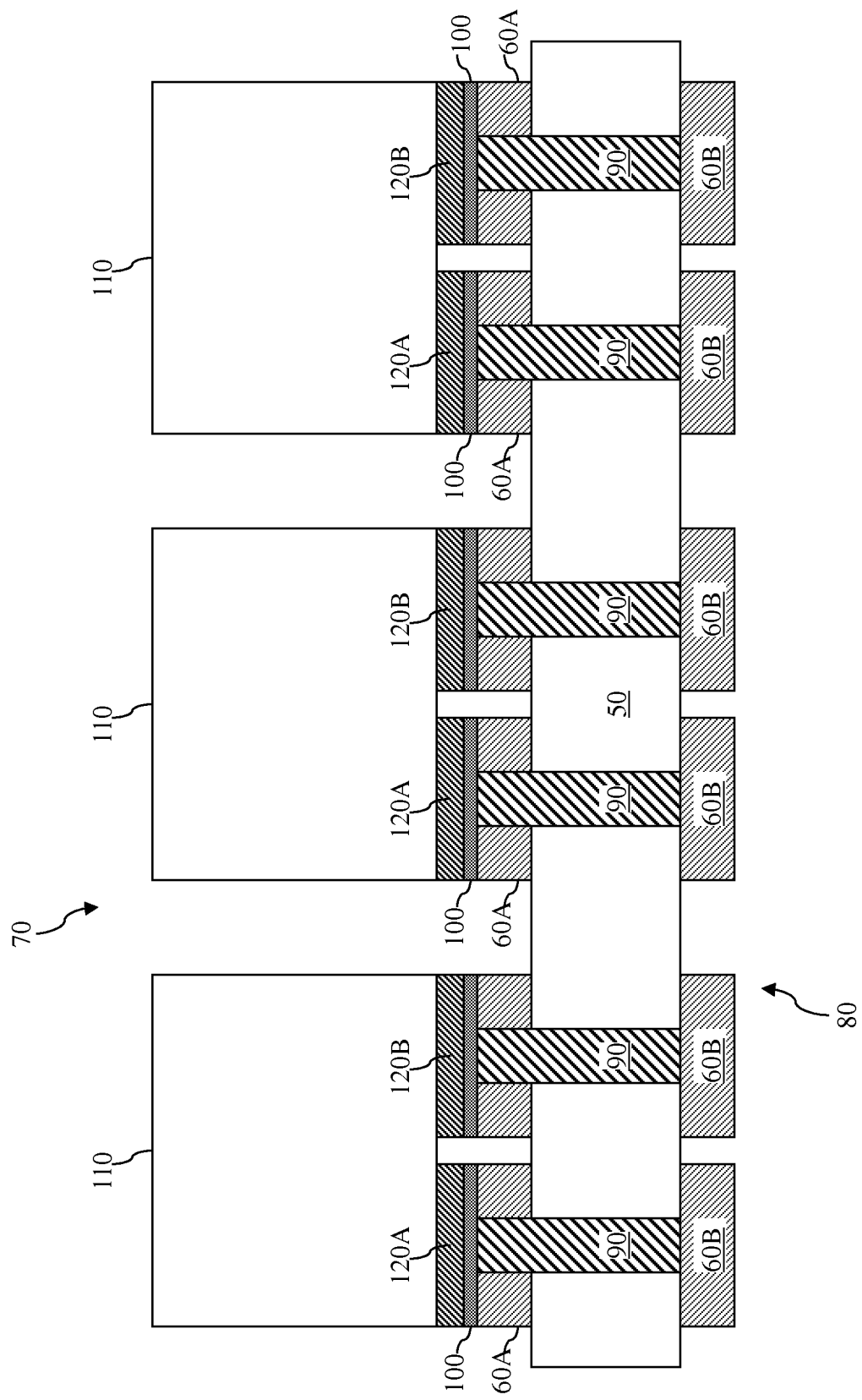

Referring now to FIG. 2, a solder paste 100 is applied on each of the conductive pads 60A from the front side 70. The solder paste 100 may contain powdered metal solder in a viscous medium such as flux. The solder paste 100 is applied for bonding the conductive pads 60A to other components, as discussed below.

A plurality of semiconductor photonic dies 110 are bonded to the conductive pads 60A through the solder paste 100. The semiconductor photonic dies 110 function as light sources for a lighting instrument. The semiconductor photonic dies 110 are LED dies in the embodiments described below, and as such may be referred to as LED dies 110 in the following paragraphs. As shown in FIG. 2, the LED dies 110 are physically spaced apart from one another. In some embodiments, the LED dies 110 are substantially evenly spaced apart from adjacent LED dies.

The LED dies 110 each include two differently doped semiconductor layers. Alternatively stated, these oppositely doped semiconductor layers have different types of conductivity. For example, one of these semiconductor layers contains a material doped with an n-type dopant, while the other one of the two semiconductor layers contains a material doped with a p-type dopant. In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In certain embodiments, the oppositely doped semiconductor layers include a p-doped gallium nitride (p-GaN) material and an n-doped gallium nitride material (n-GaN), respectively. The p-type dopant may include Magnesium (Mg), and the n-type dopant may include Carbon (C) or Silicon (Si).

The LED dies 110 also each include a light emitting layer such as a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In some embodiments, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses. In certain alternative embodiments, suitable light-emitting layers other than an MQW layer may be used instead.

Each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped layers and the MQW layer may all be formed by one or more epitaxial growth processes known in the art. For example, these layers may be formed by processes such as metal organic vapor phase epitaxy (MOVPE), molecularbeam epitaxy (MBE), metal organic chemical vapor deposition (MOCVD), hydride vapor phase epitaxy (HYPE), liquid phase epitaxy (LPE), or other suitable processes. These processes may be performed at suitable deposition processing chambers and at high temperatures ranging from a few hundred degrees Celsius to over one thousand degrees Celsius.

After the completion of the epitaxial growth processes, an LED is created by the disposition of the MQW layer between the doped layers. When an electrical voltage (or electrical charge) is applied to the doped layers of the LED 110, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. For example, the LED dies 110 herein may be blue LED emitters, in other words, they are configured to emit blue light.

As shown in FIG. 2, each LED die 110 also includes two conductive terminals 120A and 120B, which may include metal pads. Each conductive terminal 120A/120B is bonded to a respective one of the conductive pads 60A (through the solder paste 100). Since the conductive pads 60A on the front side 70 are electrically coupled to the conductive pads 60B on the back side 80, electrical connections to the LED dies 110 may be established through the conductive terminals 120A/120B from the conductive pads 60B. In the embodiments discussed herein, one of the conductive terminals 120A/120B is a p-terminal (i.e., electrically coupled to the p-GaN layer of the LED die 110), and the other one of the conductive terminals 120A/120B is an n-terminal (i.e., electrically coupled to the n-GaN layer of the LED die 110). Thus, an electrical voltage can be applied across the terminals 120A and 120B (through the conductive pads 60B) to generate light a light output from the LED die 110.

In certain embodiments, the LED dies 110 shown herein have already undergone a binning process. In more detail, a plurality of LED dies has been fabricated using standard LED fabrication processes. These LED dies may have varying performance characteristics in different areas such as light output intensity, color, current consumption, leakage, resistance, etc. A binning process involves dividing or assigning these LED dies into different categories (or bins) according to each die's performance in these performance areas. For example, a bin 1 may include LED dies that have a light output density that meets a predefined threshold, a bin 10 may include LED dies that have serious performance failures and thus need to be discarded, so on and so forth. After the LED dies are binned, a subset of the LED dies from one or more certain bins are chosen to be attached herein as the LED dies 110. The selected subset of LED dies 110 may also be referred to as reconstructed LED dies.

Figure 3:
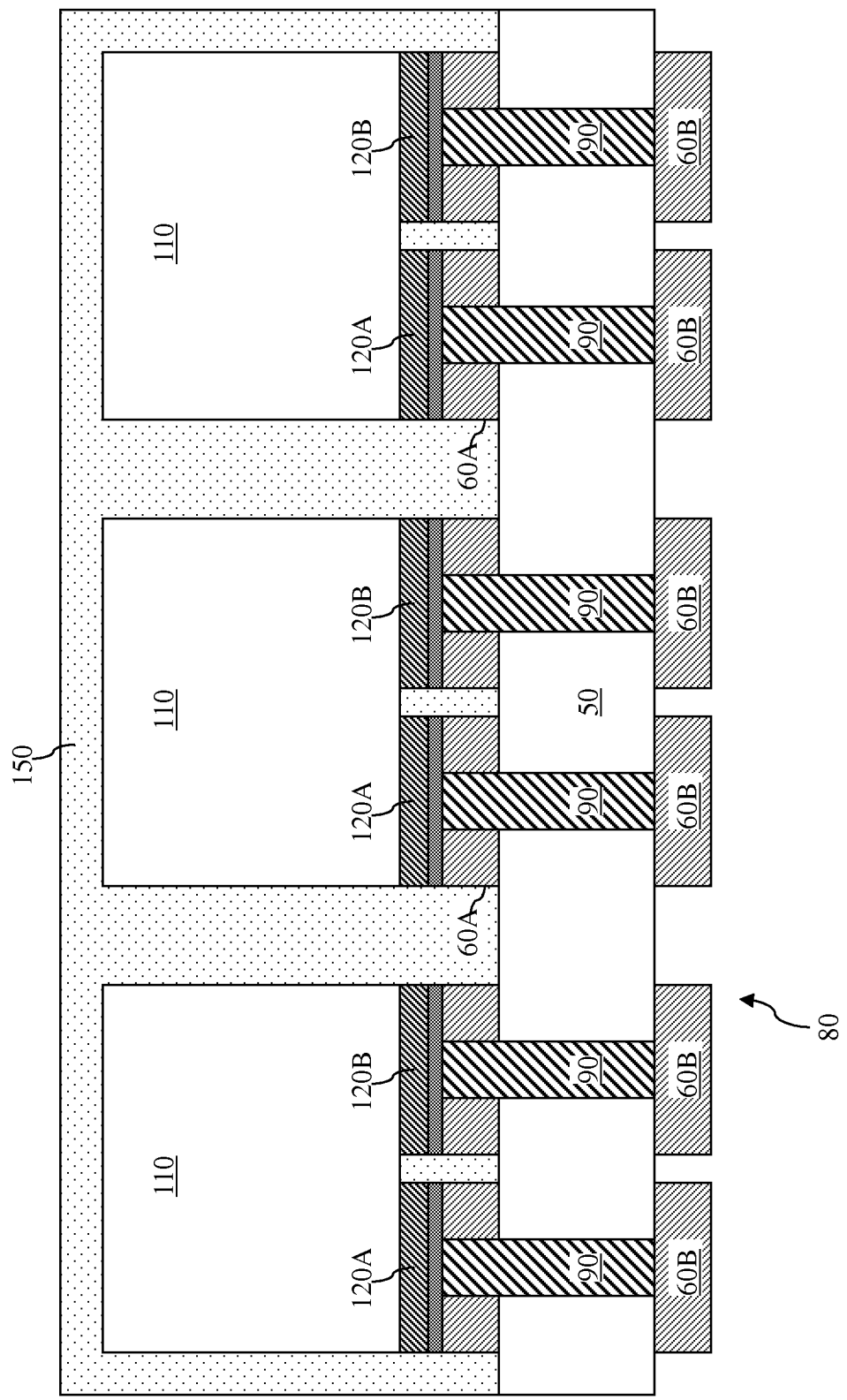

Referring now to FIG. 3, a photoconversion material such as a phosphor film 150 is applied to the LED dies 110 collectively. In more detail, the phosphor film 150 is coated around the exposed surfaces of the LED dies 110, as well as on the exposed surfaces of the conductive pads 60A and the substrate 50. The phosphor film 150 may include either phosphorescent materials and/or fluorescent materials. The phosphor film 150 is used to transform the color of the light emitted by an LED dies 110. In some embodiments, the phosphor film 150 contains yellow phosphor particles and can transform a blue light emitted by an LED die 110 into a different wavelength light. By changing the material composition of the phosphor film 150, the desired light output color (e.g., a color resembling white) may be achieved. The phosphor film 150 may be coated on the surfaces of the LED dies 110 in a concentrated viscous fluid medium (e.g., liquid glue). As the viscous liquid sets or cures, the phosphor material becomes a part of the LED package.

Wafer back side probing may also be performed at this stage. In other words, the LED dies 110 may be electrically accessed from the back side 80 of the wafer through the conductive pads 60B. This back side probing process may be done to evaluate the light output performance from the LED dies 110, for example performance with respect to the color temperature of the LED dies 110, etc. If the light output performance is unsatisfactory, the recipe for the phosphor material 150 may be modified to improve the light output performance.

Figure 4:
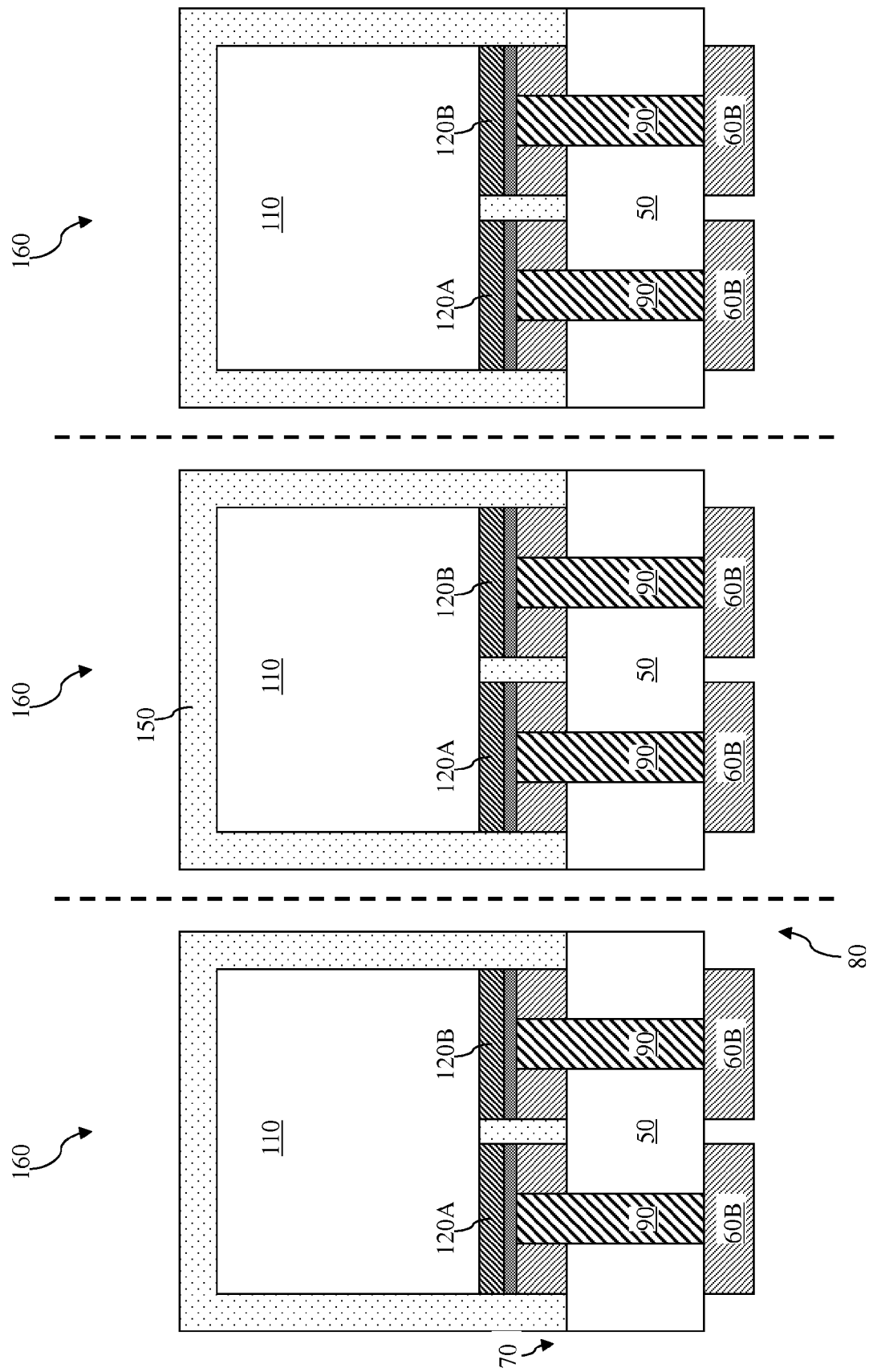

Referring now to FIG. 4, a wafer dicing process is performed to the LED dies 110 (and to the substrate 50 and the attached conductive pads 60). The wafer dicing process includes slicing portions of the phosphor material 150 between adjacent LED dies 110. The substrate 50 is also sliced completely through from the front side 70 to the back side 80. Thus, as a result of the wafer dicing process, a plurality of LED chips 160 is created by the sliced pieces of the LED dies 110 and the attached portions of the substrate 50 and the conductive pads 60. Each LED chip 160 may also be referred to as a single junction phosphor chip or package. The phosphor coating for these LED chips 160 is applied on a die level. In other words, the phosphor coating is collectively applied to all the LED dies 110 before these LED dies are diced and undergo individual package processing. As is shown in FIG. 4, the phosphor material is now conformally coated around each LED die 110. The resulting LED chip 160 can achieve small dimensions too. In some embodiments, a footprint of the LED chip 160 ranges from about (1-2 millimeters)×(1-2 millimeters).

Figure 5:
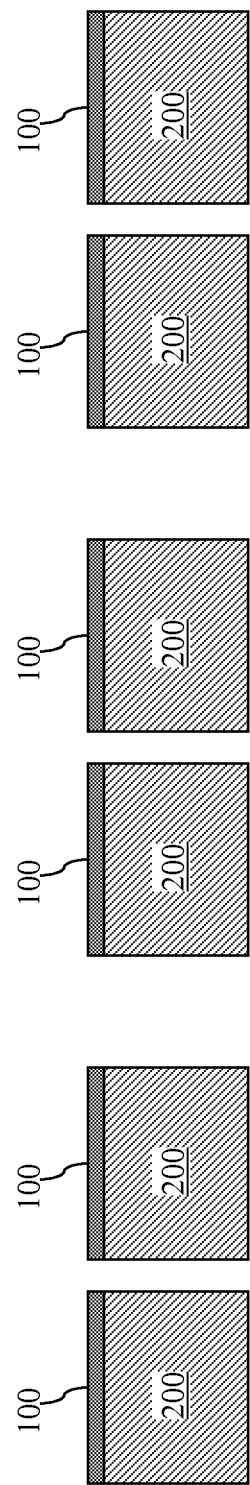
FIGS. 5-8 are diagrammatic fragmentary cross-sectional side views of a plurality of LEDs undergoing a packaging process according to some other embodiments of the present disclosure.

FIGS. 5-8 are simplified diagrammatic cross-sectional side views of a plurality of LEDs at various stages of packaging according to some alternative embodiments of the present disclosure. For reasons of clarity and consistency, similar components will be labeled the same throughout the different embodiments illustrated in FIGS. 1-8. Referring to FIG. 5, a plurality of conductive pads 200 are provided without using a substrate (such as the substrate 50 of FIG. 1). In some embodiments, the conductive pads 200 include lead frames, such as silver platting. A solder paste 100 is applied on each conductive pad 200.

Figure 6:
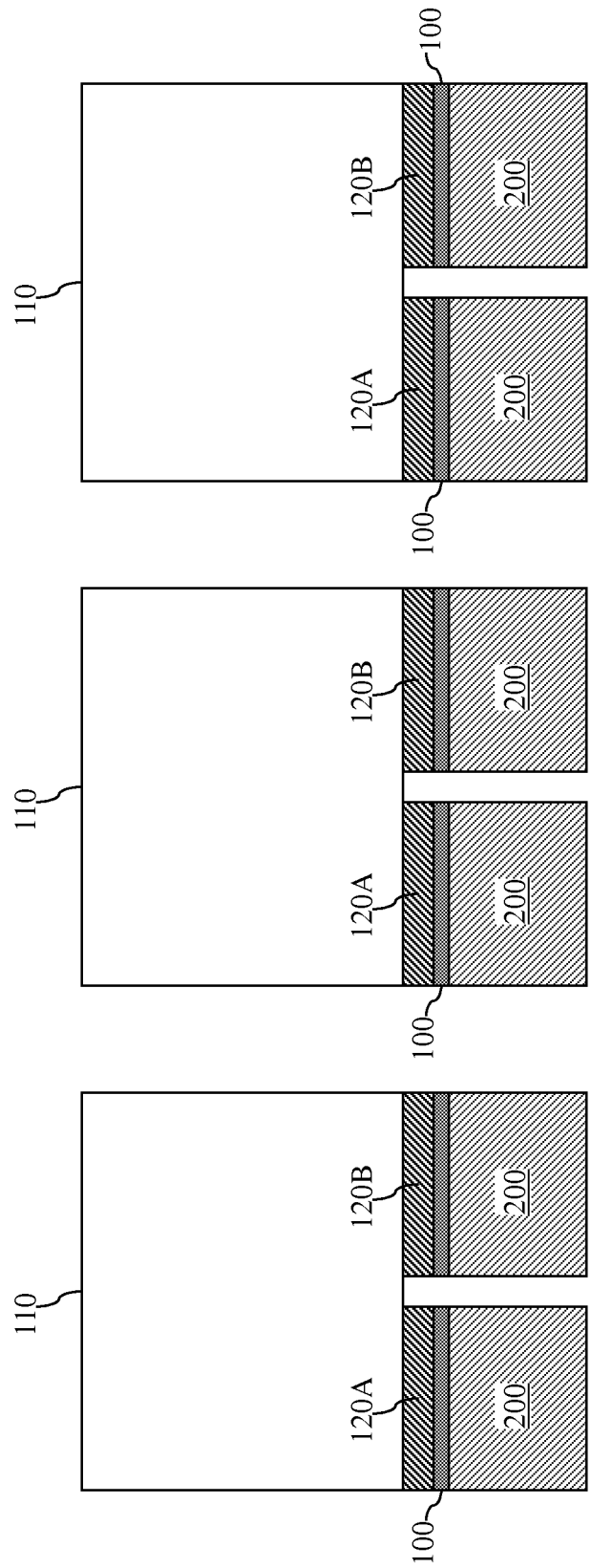

Referring now to FIG. 6, a plurality of LED dies 110 is bonded to the conductive pads 200 through the solder paste 100. As discussed above, these LED dies 110 may belong to a "binned" subset of a greater number of LED dies. Each LED die 110 has two conductive terminals 120A and 120B, one of which is the p-terminal, and the other one of which is the n-terminal. Thus, electrical access to the LED die may be established through these terminals 120A/120B and the conductive pads 200 electrically coupled to the terminals 120A/120B.

Figure 7:
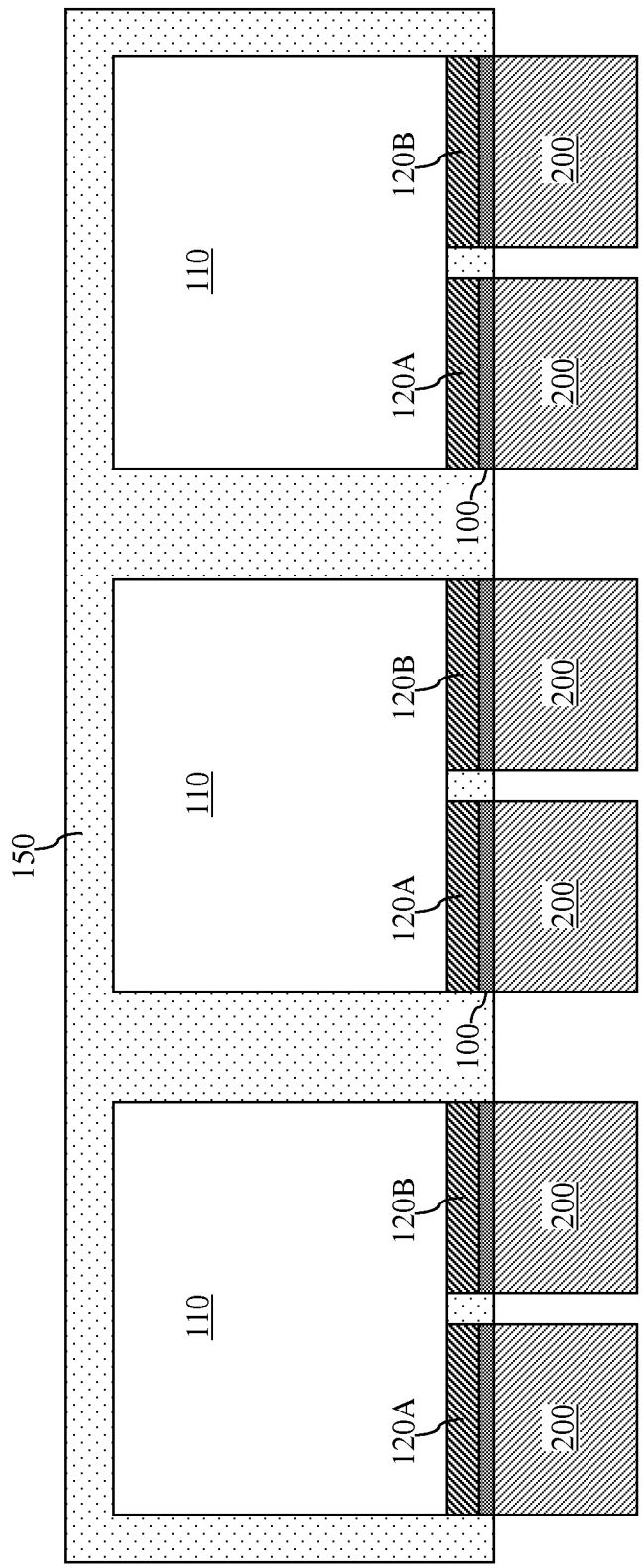

Referring now to FIG. 7, a photoconversion material 150 such as a phosphor film is coated around all the LED dies 110 collectively. Similar to the embodiments of FIGS. 1-4, the phosphor coating here is done at a die level. Wafer probing may be performed at this stage in order to tune the phosphor recipe.

Figure 8:
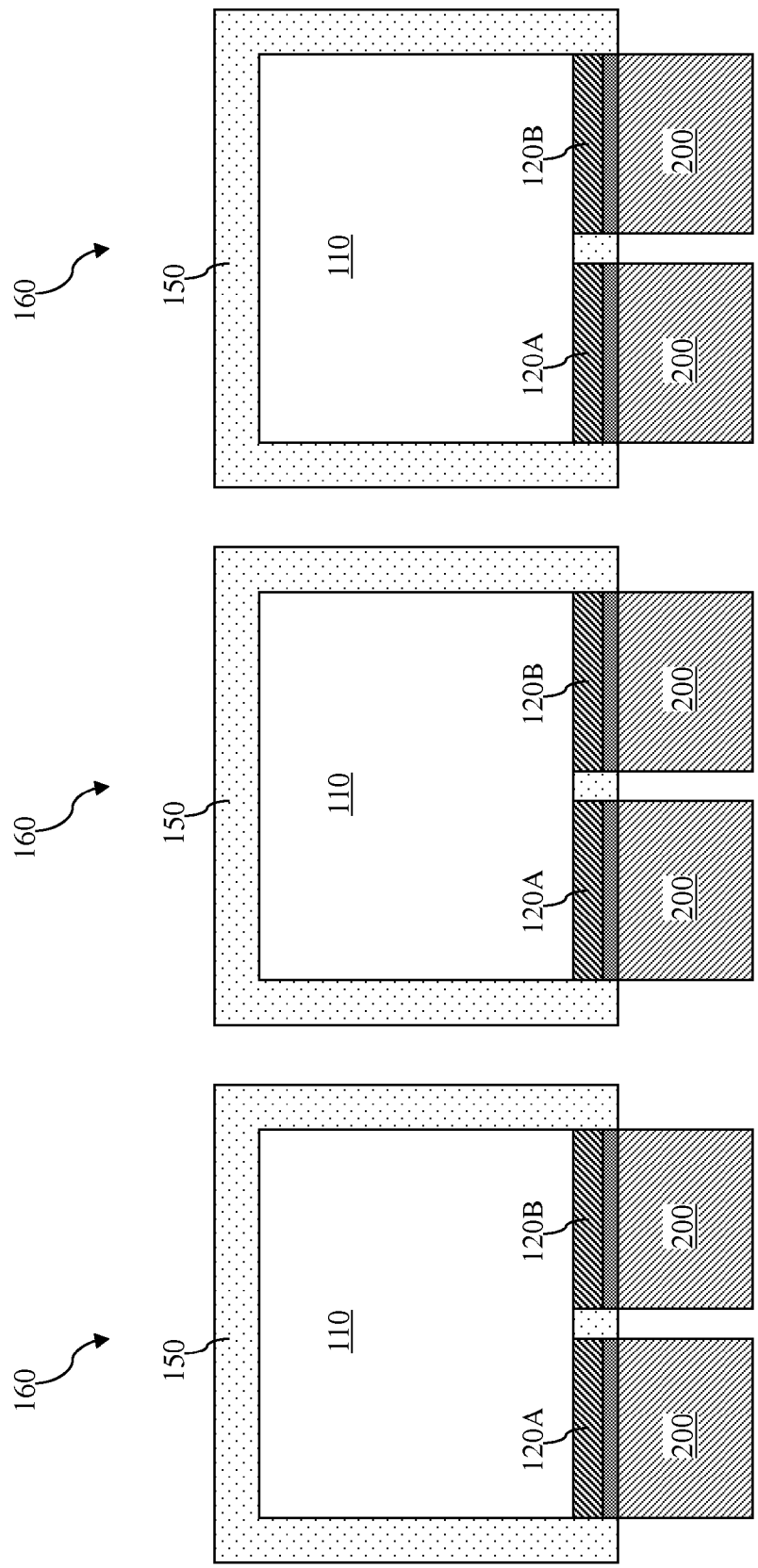

Referring now to FIG. 8, a dicing process is performed to form individual LED chips 160. As a part of the dicing process, the phosphor material 150 between adjacent LED dies 110 is sliced completely through to separate the LED dies 110. In this manner, a plurality of single junction phosphor chips 160 is created. Each chip 160 includes an LED die 110 on which a phosphor film 150 is conformally coated. In some embodiments, a footprint of the chip 160 ranges from about (1-2 millimeters)×(1-2 millimeters).

The embodiments of the present disclosure discussed above offer advantages over existing methods. However, not all advantages are discussed herein, other embodiments may offer different advantages, and that no particular advantage is required for any embodiment.

One of the advantages of the embodiments of the present disclosure is that the phosphor coating can be done at a die level. In other words, the phosphor coating can be applied to all the LEDs collectively. A plurality of phosphor-coated LED dies is then formed by the subsequent dicing process. By doing so, the phosphor coating is fast and efficient, whereas conventional methods laborious processes that apply phosphor to each LED die. Furthermore, since the embodiments of the present disclosure allow phosphor film to be conformally coated around each LED die, the photoconversion efficiency is improved, and very little phosphor material is wasted. In comparison, some existing methods of applying phosphor to LED dies may result in a significant amount of phosphor material being wasted. In addition, the embodiments of the present disclosure entail flexible processes that can be easily integrated into existing LED fabrication process flow.

Figure 9:
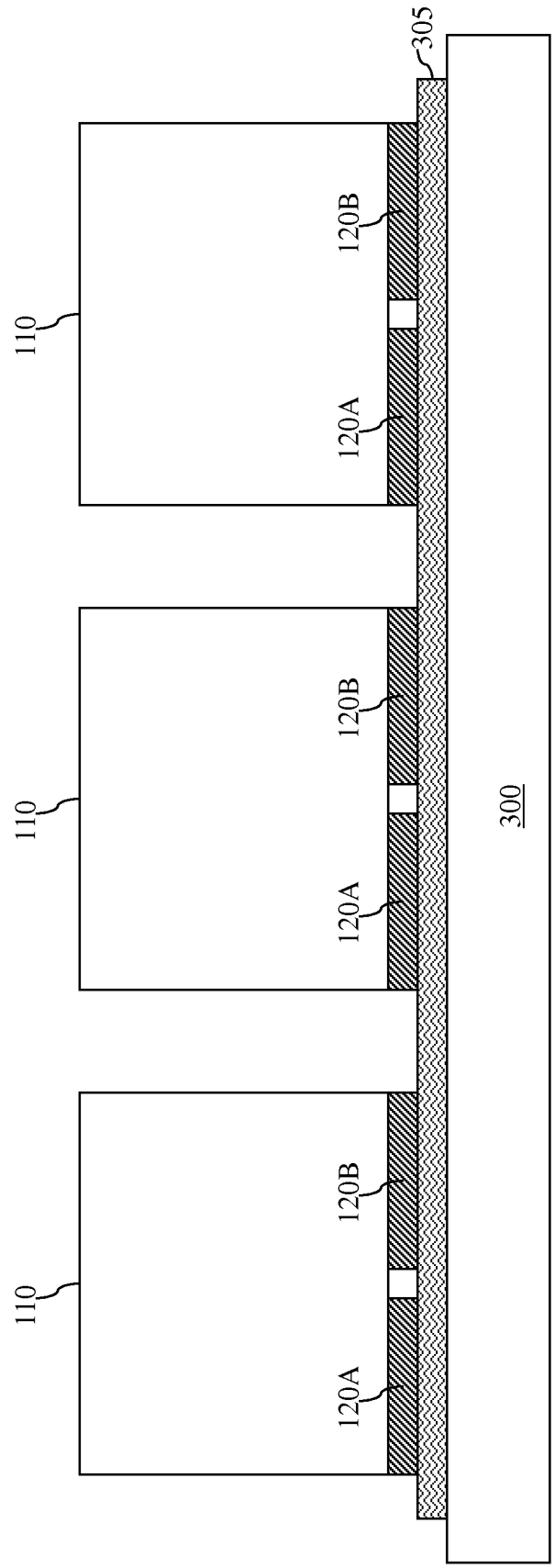

FIGS. 9-15, 16A-16C, and 17-18 are simplified diagrammatic cross-sectional side views of a plurality of LEDs at various stages of packaging according to some embodiments of the present disclosure. For reasons of consistency and clarity, similar components that appear in FIGS. 1-8 may be labeled the same in FIGS. 9-15, 16A-16C, and 17-18. Referring to FIG. 9, a substrate 300 is provided. The substrate 300 may include a glass substrate, a silicon substrate, a ceramic substrate, a gallium nitride substrate, or any other suitable substrate that can provide mechanical strength and support. The substrate 300 may also be referred to as a carrier substrate. A tape 305 is disposed on the substrate 300. In some embodiments, the tape 305 may contain an adhesive material. In yet other embodiments, a photoresist material may be used in place of the tape 305. In further embodiments, an ultraviolet gel or a thermal curing gel may also be used in place of the tape 305.

A plurality of semiconductor photonic dies 110 are disposed on the tape 305. The semiconductor photonic dies 110 function as light sources for a lighting instrument. The semiconductor photonic dies 110 are LED dies in the embodiments described below, and as such may be referred to as LED dies 110 in the following paragraphs. As shown in FIG. 9, the LED dies 110 are physically spaced apart from one another. In some embodiments, the LED dies 110 are substantially evenly spaced apart from adjacent LED dies. The LED dies 110 are similar to the LED dies 110 discussed above with reference to FIGS. 2-8.

It is also understood that the spacing between adjacent LED dies 110 may be tunable. In other words, depending on design requirements and manufacturing concerns, the spacing between the adjacent LED dies 110 may be increased or decreased prior to their disposition on the tape 305. In certain embodiments, the spacing separating adjacent LED dies 110 is in a range from about 0.5 mm to about 2 mm, for example about 1 mm.

Figure 10:
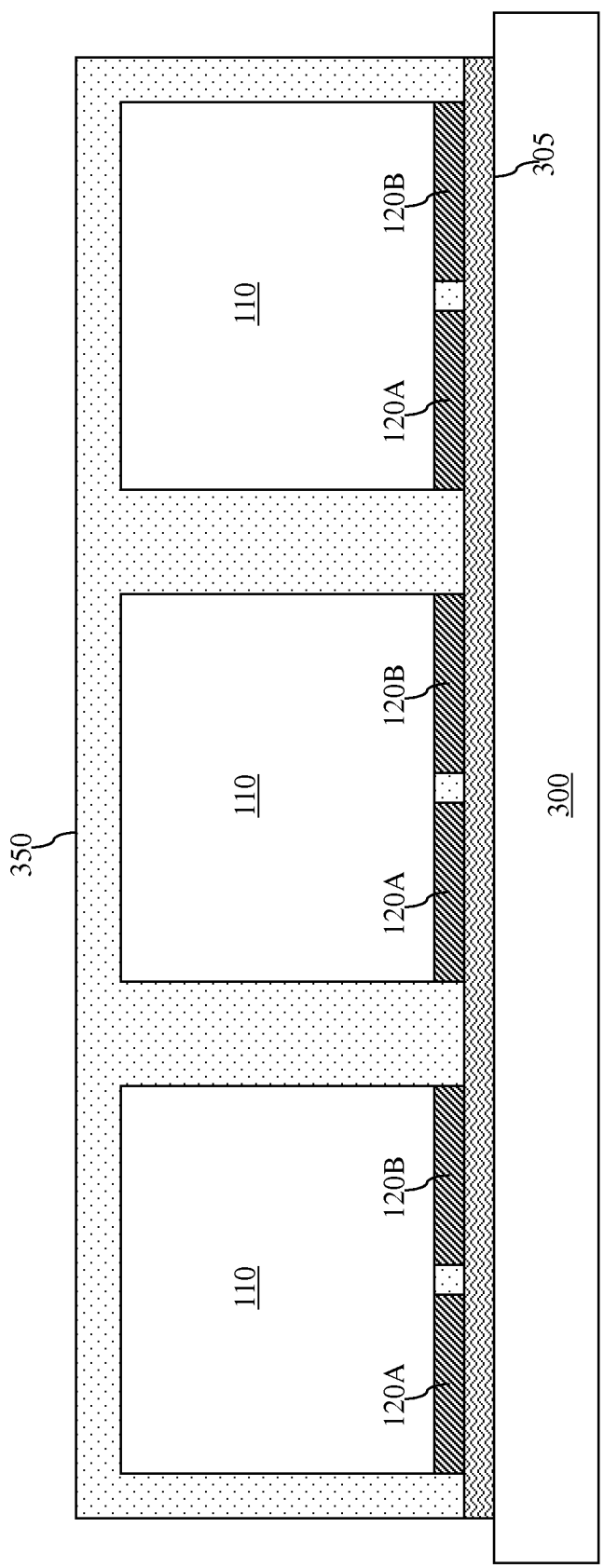

Referring now to FIG. 10, a photo-conversion material 350 such as a phosphor film is coated around all the LED dies 110 collectively. In more detail, the phosphor film 350 is coated around the exposed surfaces of the LED dies 110, as well as on the exposed surfaces of the tape 305 and/or the substrate 300. The phosphor film 350 may include either phosphorescent materials and/or fluorescent materials. The phosphor film 350 is used to transform the color of the light emitted by an LED dies 110. In some embodiments, the phosphor film 350 contains yellow phosphor particles and can transform a blue light emitted by an LED die 110 into a different wavelength light. In other embodiments, a dual phosphor may be used, which may contain yellow powder and red powder phosphor. By changing the material composition of the phosphor film 350, the desired light output color (e.g., a color resembling white) may be achieved. In some embodiments, the phosphor film 350 includes at least two sub-layers (i.e., a composite layer structure). For example, one of these sub-layers may contain a gel mixed with phosphor particles but not diffuser particles, while the other one of these sub-layers may contain a gel mixed with diffuser particles but not phosphor particles. As another example, one of these sub-layers may contain yellow phosphor particles mixed with gel, while the other one of these sub-layers may contain red phosphor particles mixed with gel.

The phosphor film 350 may be coated on the surfaces of the LED dies 110 in a concentrated viscous fluid medium (e.g., liquid glue or gel). In certain embodiments, the viscous fluid may include silicone epoxy and have a refractive index in a range from about 1.4 to about 2. In some embodiments, diffuser particles may also be mixed in the viscous fluid. The diffuser particles may include, as examples, silica, PMMA, $ZrO_2$, or silicon. In some other embodiments, one layer of the viscous fluid may be mixed with the phosphor particles, while another layer of the viscous fluid may be mixed with the diffuser particles, and then one of the two layers of the viscous fluid is applied over the other. Similarly, in some embodiments, one layer of the viscous fluid may be mixed with yellow phosphor, while the other layer of the viscous fluid may be mixed with red phosphor. The phosphor film 350 is used herein to denote a single layer of phosphor mixed with the gel, or multiple layers of phosphor mixed with the gel. As the viscous liquid sets or cures, the phosphor material becomes a part of the LED package. In some embodiments, a curing temperature in a range between about 130 degrees Celsius to about 170 degrees Celsius is used.

Wafer probing may also be performed at this stage. In other words, the LED dies 110 may be electrically accessed through the conductive terminals 120A and 120B. This wafer probing process may be done to evaluate the light output performance from the LED dies 110, for example performance with respect to the color temperature of the LED dies 110, etc. If the light output performance is unsatisfactory, the recipe for the phosphor material 350 may be modified to improve the light output performance.

Figure 11:
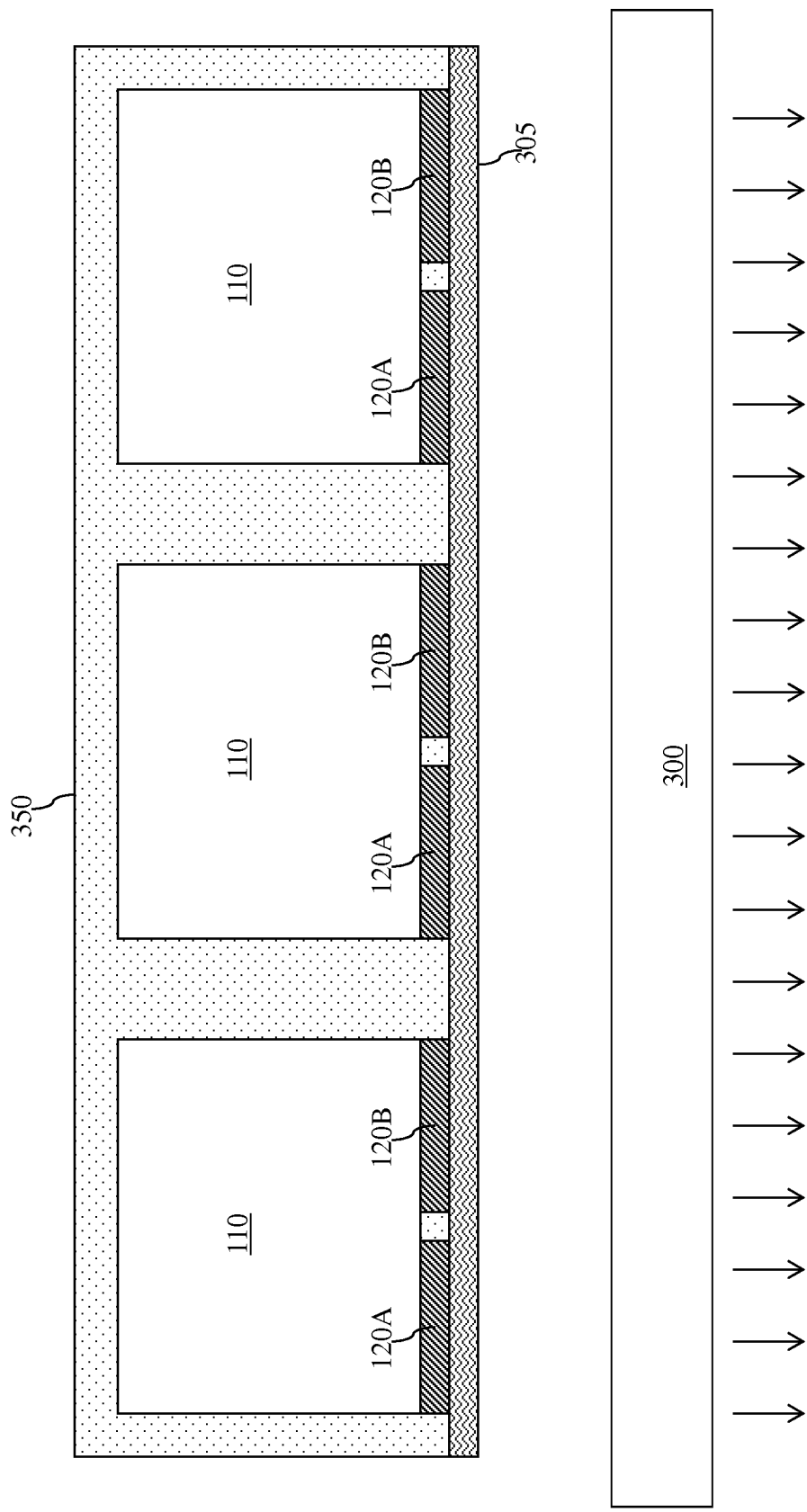

Referring now to FIG. 11, the substrate 300 is removed. In some embodiments, the substrate 300 is removed through a laser lift-off process. In other embodiments, the substrate 300 may be removed using an etching process or another suitable process.

Figure 12:
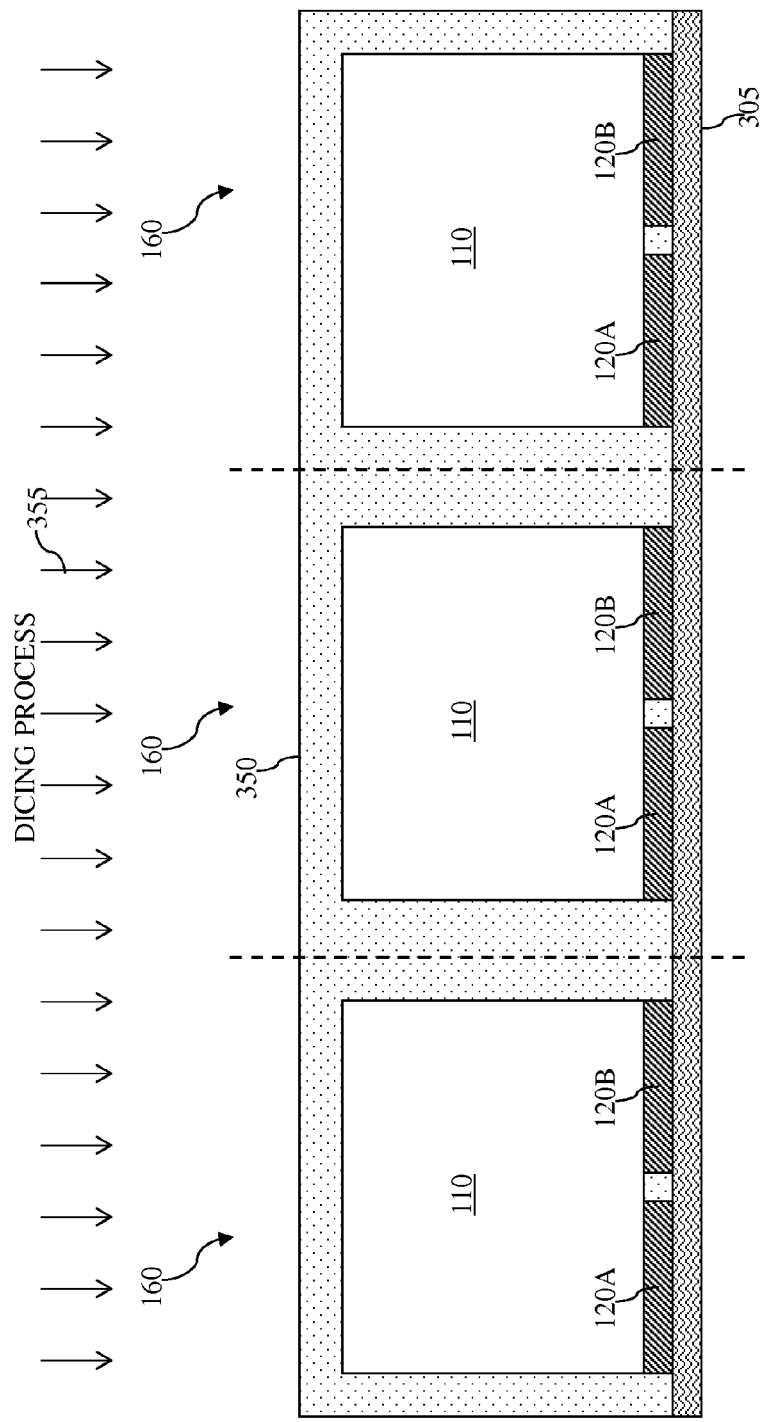

Thereafter, referring to FIG. 12, a dicing process 355 is performed to singulate the LED dies 110. In some embodiments, the dicing process 355 is performed using a die saw. In alternative embodiments, other suitable cutting/slicing means may be used. As a part of the dicing process 355, the phosphor material 350 between adjacent LED dies 110 is sliced completely through to separate the LED dies 110. In this manner, a plurality of single junction phosphor chips 160 (shown in FIG. 13) is created. Each chip 160 includes an LED die 110 surrounded by a phosphor film 350. In other words, the phosphor coating is collectively applied to all the LED dies 110 before these LED dies are diced and undergo individual package processing. The tape 305 is removed from each chip 160. In some embodiments, a footprint of the chip 160 ranges from about (1-2 millimeters)×(1-2 millimeters).

Figure 14:
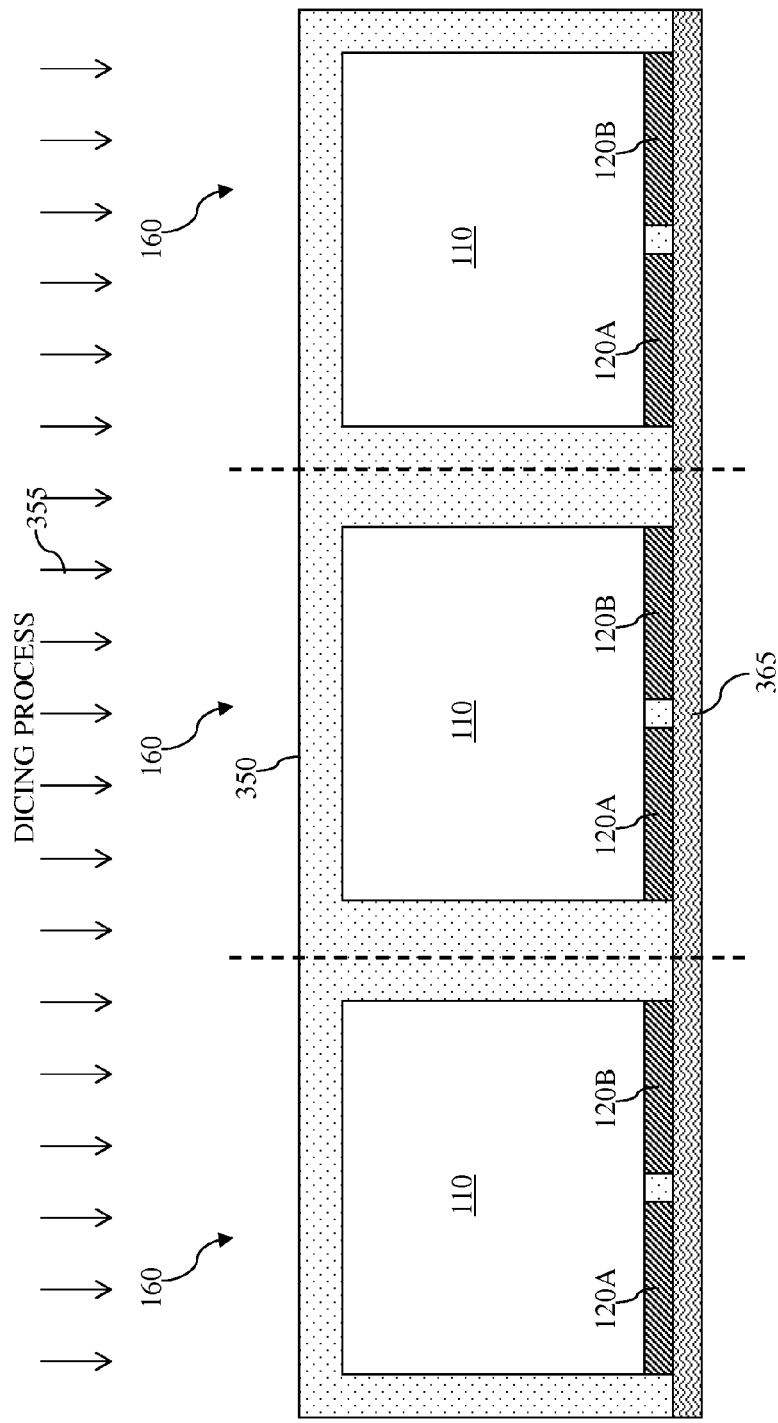

In some scenarios, the tape 305 may become damaged while the substrate 300 is removed (FIG. 11). In these cases, the damaged tape 305 may also be removed from the LED dies 110, and a new tape 365 may be used to re-tape the LED dies 110 before the dicing process 355 is performed, as shown in FIG. 14.

Regardless of whether the new tape 365 is used, it can be seen that the substrate 300 is removed before the dicing process 355 takes place. By doing so, several advantages are offered over existing methods, though it is understood that not all advantages are discussed herein, other embodiments may offer different advantages, and that no particular advantage is required for any embodiment. One advantage is that the removal of the substrate 300 means that it is not cut or diced by the dicing process 355. Consequently, the substrate 300 is substantially unscathed and may be used again for future fabrication. For example, the substrate 300 may be used as a carrier substrate for a different batch of LED dies. The reusability of the substrate 300 reduces LED fabrication costs. Another advantage is that, since the substrate 300 need not be a part of the dicing process 355, the dicing process 355 can be performed faster, which enhances the efficiency of the LED packaging. In addition, the embodiments of the present disclosure entail flexible processes that can be easily integrated into existing LED fabrication/packaging process flow.

Figure 15:
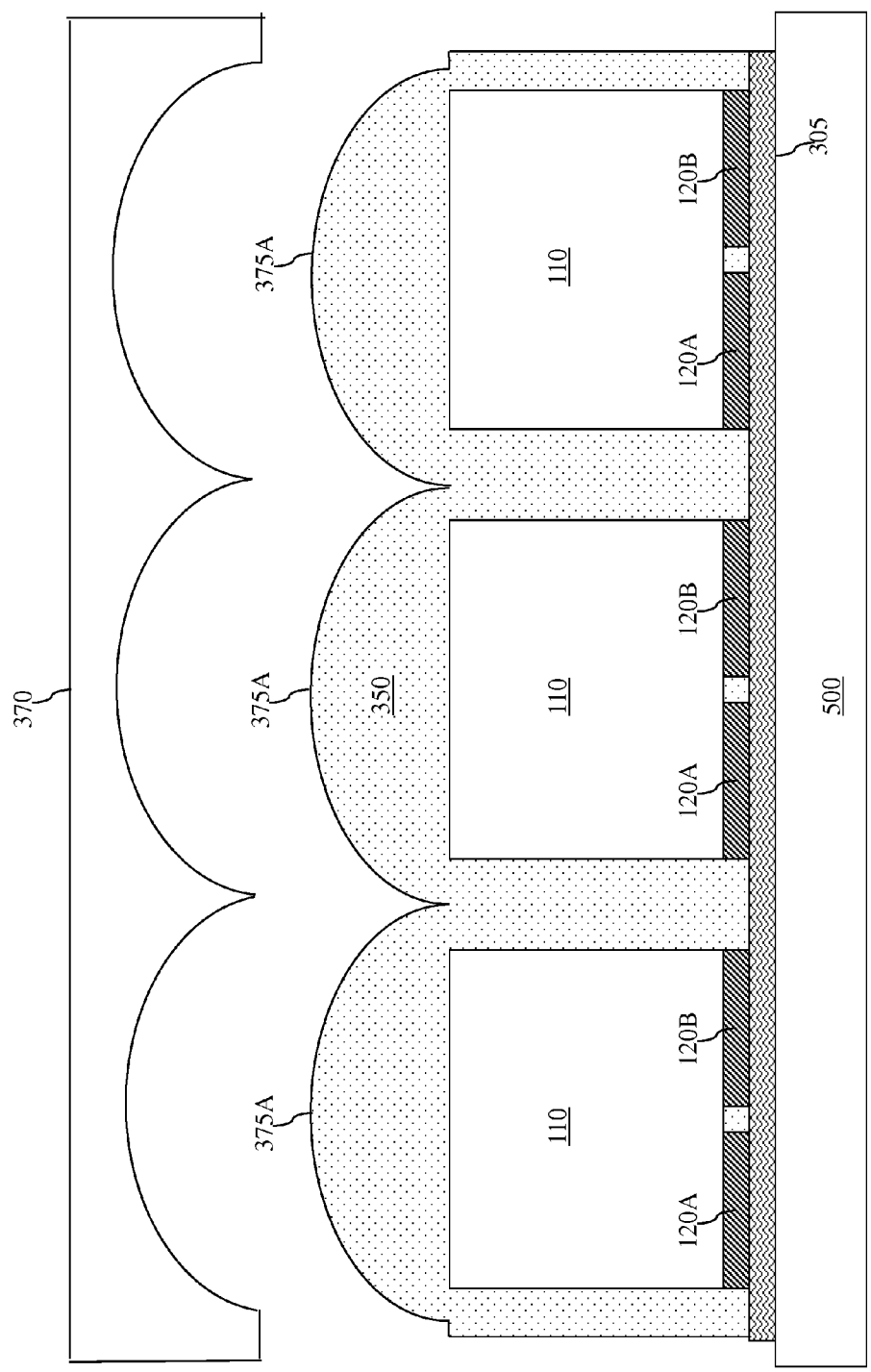

FIGS. 15, 16A, 16B, 16C, and 17 are simplified diagrammatic cross-sectional side views of a plurality of LEDs at various stages of packaging according to some alternative embodiments of the present disclosure. For reasons of consistency and clarity, similar components appearing in FIGS. 9-17 will be labeled the same. Referring to FIG. 15, a plurality of LED dies 110 are disposed on the substrate 300. A phosphor film 350 is also coated around the LED dies 110. Unlike the embodiment shown in FIGS. 9-14, however, the phosphor film 350 is shaped by a molding stencil 370. As a result of being shaped by the molding stencil 370 and being cured, an upper surface 375A of the phosphor film 350 exhibits a convex dome-like profile over each of the LED dies 110. In other words, for each LED die 110, there is a portion of the upper surface 375 of the phosphor film 350 that is substantially rounded and curved. This geometric configuration of the phosphor film 350 helps focus light emitted by the LED dies 110 underneath, thereby serving as a lens for the LED dies 110.

Figure 16B:
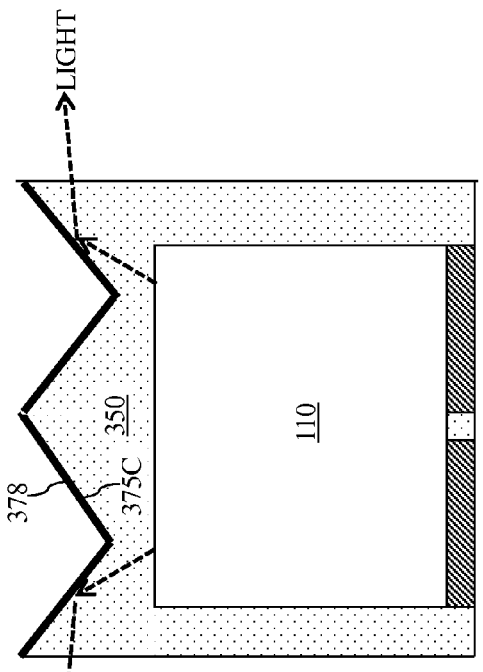
FIGS. 16A-16C are diagrammatic fragmentary cross-sectional side views of differently-shaped side-lit batwing LED dies according to various aspects of the present disclosure.
Figure 16A:
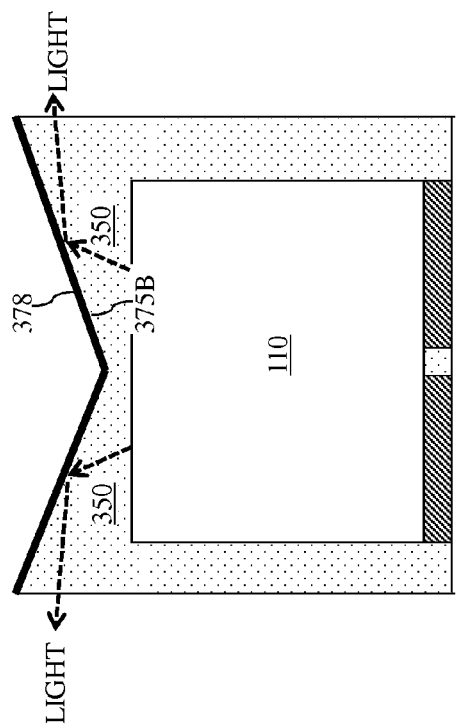
Figure 16C:
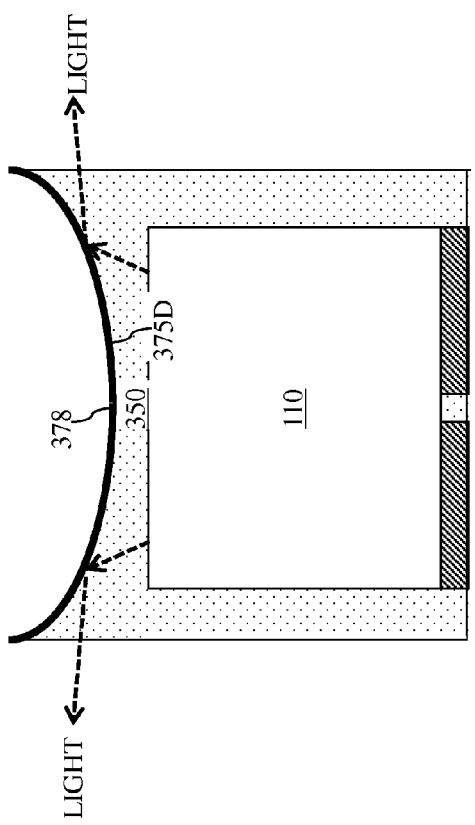

It is understood that the dome-like profile for the phosphor film 350 is merely an example. In other embodiments, different profiles may be achieved for the phosphor film 350 so that the phosphor film can further serve as a desired lens for the LED dies 110. For example, FIGS. 16A-C illustrate different geometric profiles for the phosphor film 350. For reasons of simplicity, each Figure only illustrate the geometric profile for a single LED die 110, though it is understood that the same phosphor profile is achieved for each of the plurality of LED dies 110. In FIG. 16A, the phosphor film 350 is shaped (e.g., by a suitable molding stencil) so that its upper surface 375B exhibits a concave V-shape profile. In FIG. 16B, the phosphor film 350 is shaped (e.g., by a suitable molding stencil) so that its upper surface 375C exhibits a concave W-shape profile. In FIG. 16C, the phosphor film 350 is shaped (e.g., by a suitable molding stencil) so that its upper surface 375D exhibits a concave U-shape profile.

As shown in FIGS. 16A-16C, a reflective layer 378 is formed over the surfaces 375B/C/D of each of the phosphor films 150. The reflective layer 378 may contain a metal material such as silver or aluminum in some embodiments. The reflective layer 378 reflects radiation, for example light emitted by the LED dies 110. Therefore, the light will not propagate out upwards. Instead, the light will be propagated in a sideways manner due to the presence of the reflective layer 378. As such, each of the phosphor profiles shown in FIGS. 16A-16C are characterized as side-lit batwing profiles. The LED dies 110 with the phosphor coatings (serving as lenses) shown in FIGS. 16A-16C are said to be side-lit batwing emitters. In comparison, a lambertian emitter (e.g., the LED die 110 with the dome-like phosphor shape shown in FIG. 15) emits light laterally as well as vertically (i.e., straight up).

One of the advantages of shaping the phosphor film 350 to have a suitable lambertian or side-lit batwing profile is that it is cost-effective to do so. Since the phosphor film 350 itself serves as the lens, no additional secondary lenses are needed. In addition, the elimination of a potential secondary lens reduces a size of the LED package, thereby making the overall package more compact. It is understood that additional phosphor profiles may be achieved, but they are not specifically illustrated or discussed herein for reasons of simplicity. Further, for the sake of providing an illustration, the embodiment shown in FIGS. 16-17 and discussed below use a dome-like profile for the phosphor film 350, though it is understood that the other side-lit batwing profiles of FIGS. 16A-16C may be applicable as well.

Figure 17:
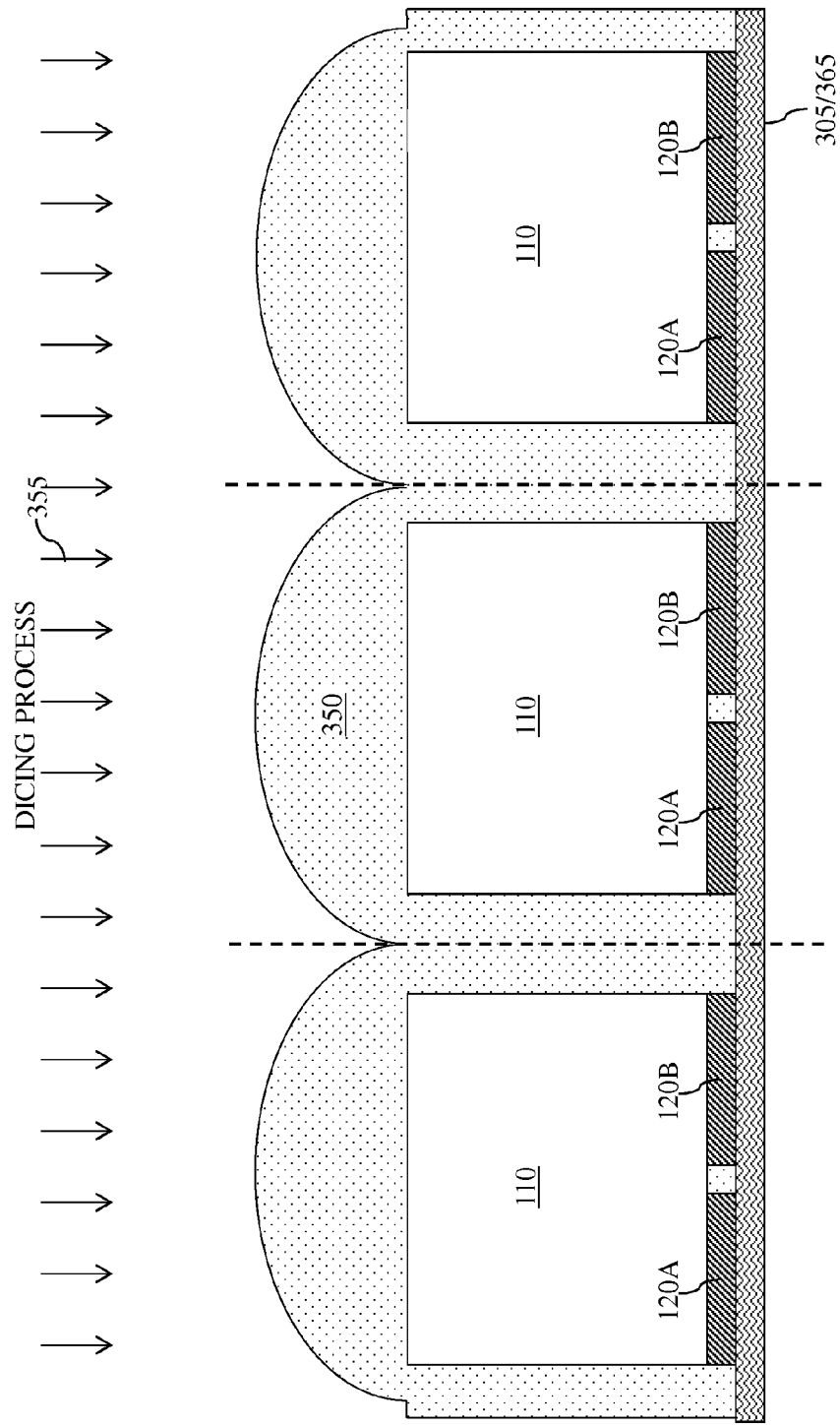

Referring now to FIG. 17, after the shaping and curing of the phosphor film 350, the substrate 300 is removed so as to preserve the substrate 300 for future use. In some embodiments, the tape 305 need not be removed. In other embodiments, the tape 305 is also removed, and a new tape 365 is then used to replace the removed tape 305. Thereafter, a dicing process 355 is performed to singulate the LED dies 110. As a result, individual LED chips 160 may be formed, as shown in FIG. 18. Once again, since the substrate 300 is removed before the dicing process, the substrate 300 may be reused for future fabrication/packaging processes, thereby reducing packaging time and cost.

Figure 13:
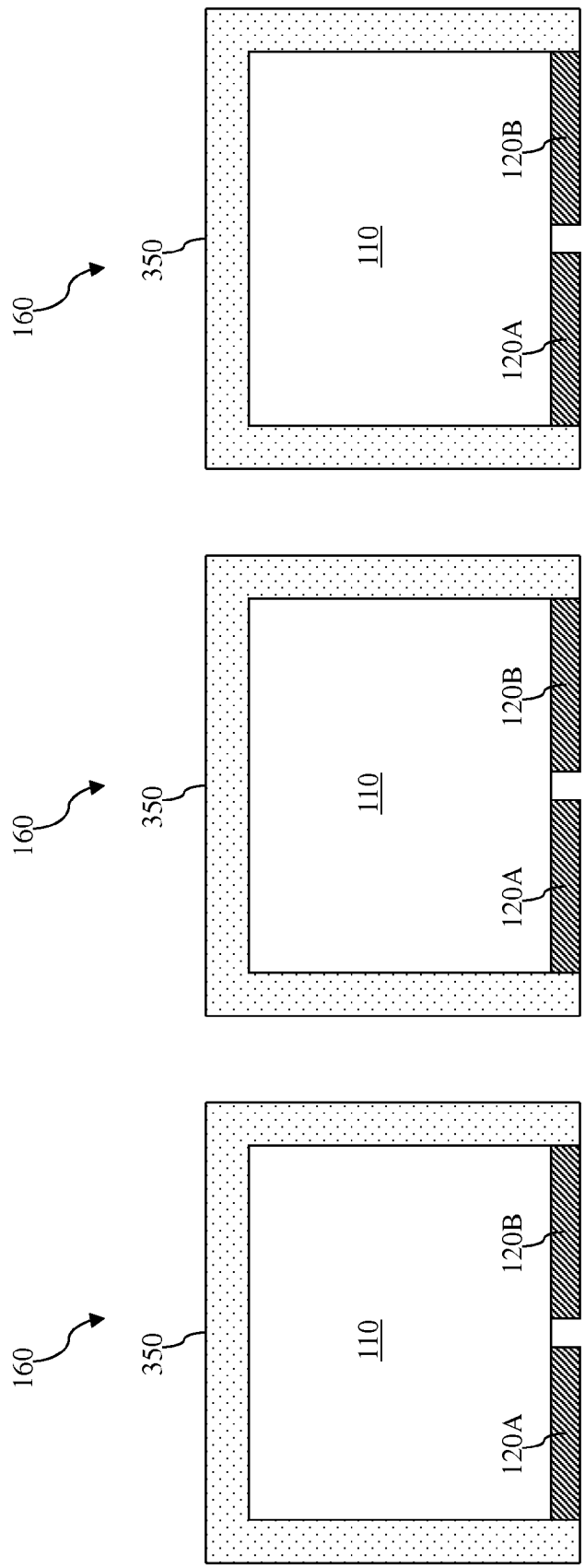
Figure 19A:
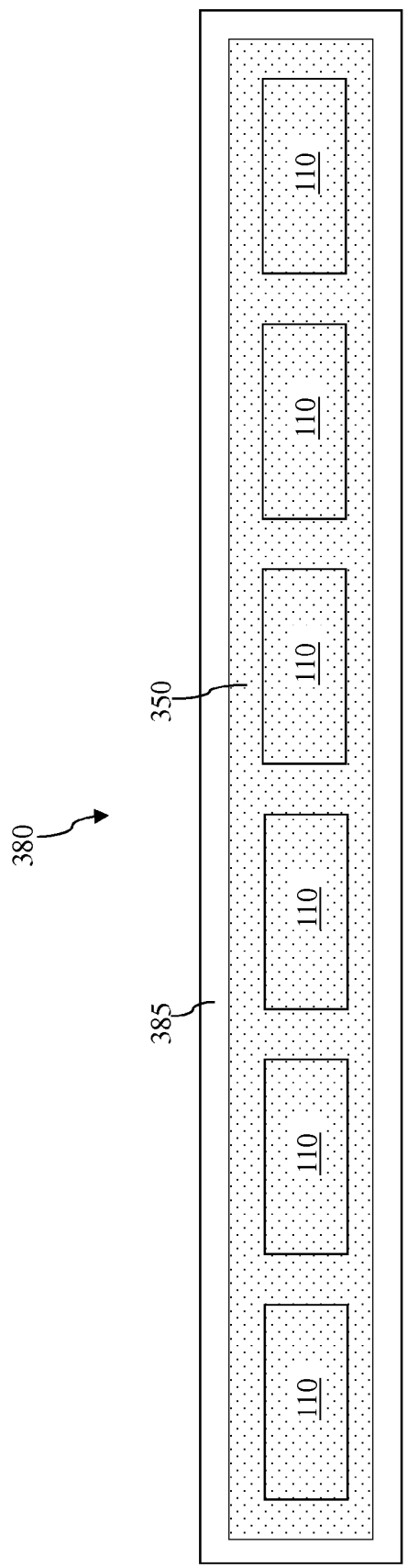
FIGS. 19A and 19B are a diagrammatic fragmentary top view and a cross-sectional view, respectively, of an embodiment of an LED lighting module according to various aspects of the present disclosure.

The singulated LED chips 160 shown in FIGS. 13 and 18 may be referred to as single junction LED chips. However, the concepts of the present disclosure may apply to multi-junction LED chips too. For example, referring now to FIG. 19A, a simplified diagrammatic top view of an LED lighting module 380 is shown. The LED lighting module 380 includes a plurality of LED dies 110 arranged in a row. The LED dies 110 have undergone a packaging process similar to those discussed above with reference to FIGS. 9-18. However, unlike the embodiments associated with FIGS. 9-18, the LED dies 110 are not singulated into individual LED chips. Instead, the dicing process is performed so that a plurality of them (i.e., the row of LEDs) are kept together and not diced. To accomplish this, the dicing process may be performed in only one direction (e.g., dicing only horizontally or only vertically) so that a matrix of LED dies are diced into a plurality of rows (or a plurality of columns) of LED dies. Alternatively, two dimensional dicing may still be employed, but a predetermined number of LED dies in a row (or column) will not undergo dicing for the LED dies in the row (or column), though these LED dies are still separated from adjacent rows (or columns) of LED dies by dicing. Once again, the substrate 300 is removed before the dicing process is performed, thereby allowing the substrate 300 to be reused. A phosphor film 350 may be coated over the row of LED dies 110. In any case, the row of LED dies 110 in the LED lighting module 380 may be disposed on a board 385, such as a printed circuit board (PCB).

Figure 19B:
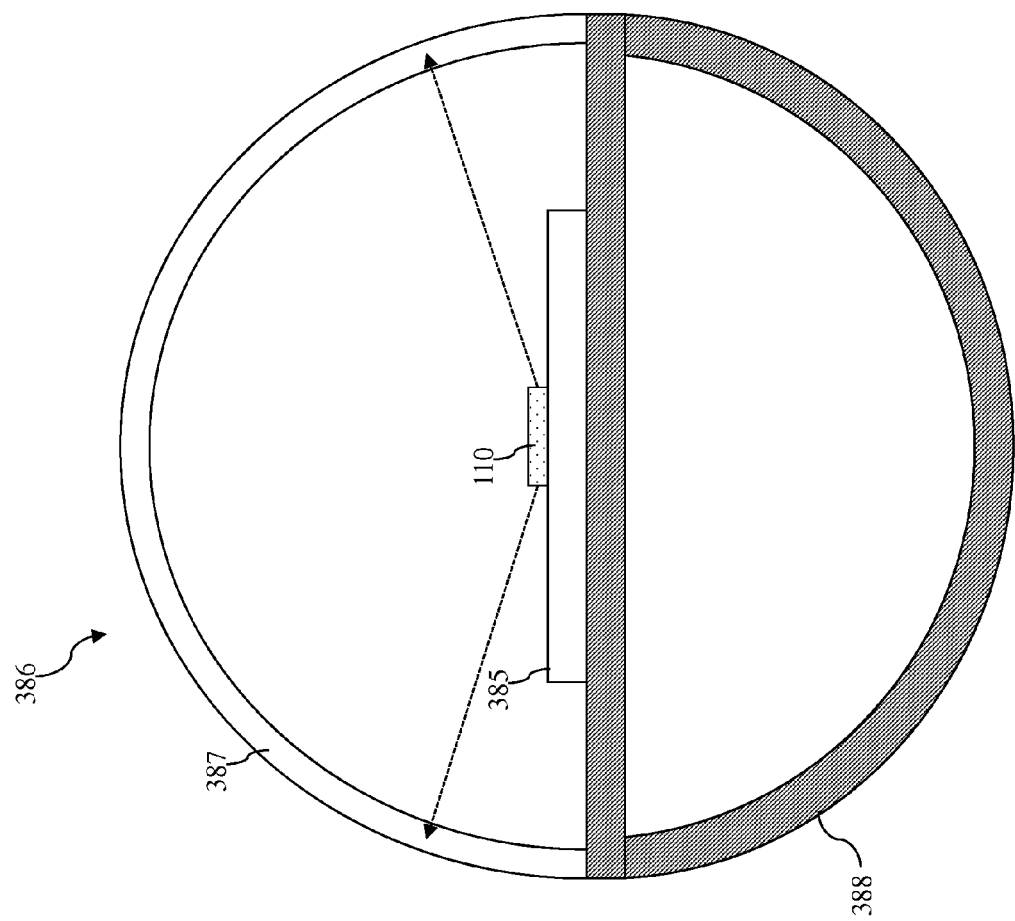

It is understood that, with transmitting or diffusive housing, a luminaire of a T5 or T8 type light tube incorporating light module 380 can easily be formed. For example, referring to FIG. 19B, a simplified cross-sectional side view of a T5 or T8 type of light tube 386 is illustrated. The light tube 386 has a housing 387, which may be approximately circular or round. The housing 387 provides a cover and protection for the light-emitting elements housed therein, for example the phosphor-coated LED dies 110 discussed above (only one of which is shown in the cross-sectional view herein). For example, the LED dies 110 are implemented as the lighting module 380 shown in FIG. 19A, which is disposed on a PCB board 385. The PCB board 385 may be thermal conductively coupled to a heat sink 388. Once again, the phosphor coated LED dies 110 do not need a secondary lens, since the phosphor may be molded into a suitable shape to function as a suitable lens. Therefore, the light tube 386 may be flexibly configured to have a desired type of light output.

Figure 20:
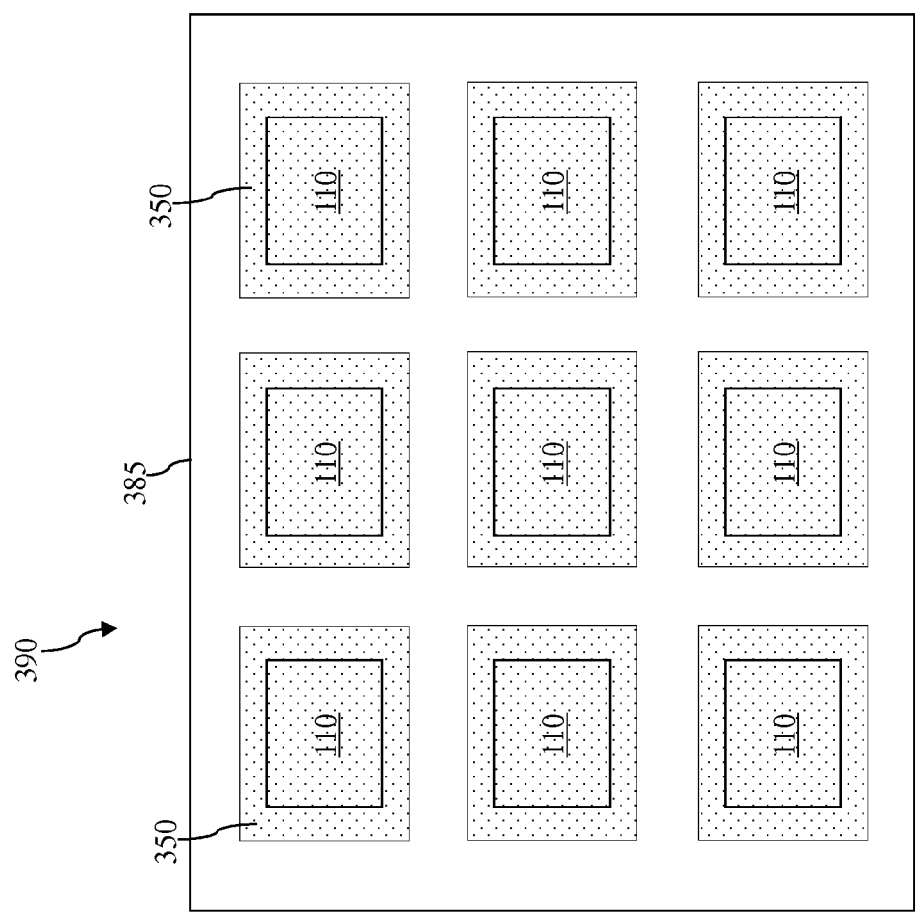
FIGS. 20-21 are diagrammatic fragmentary top views of various embodiments of LED lighting modules according to various aspects of the present disclosure.

FIG. 20 illustrates a simplified diagrammatic top view of another LED lighting module 390 having a plurality of LED dies 110 arranged in a matrix (i.e., rows and columns). These LED dies 110 have been singulated without dicing the carrier substrate. A phosphor film 350 may be applied to the LED dies 110 before the dicing process. After the dicing process, each LED die 110 is coated around with phosphor film 350. The LED dies 110 may then be placed on the board 385, such as a PCB.

Figure 21:
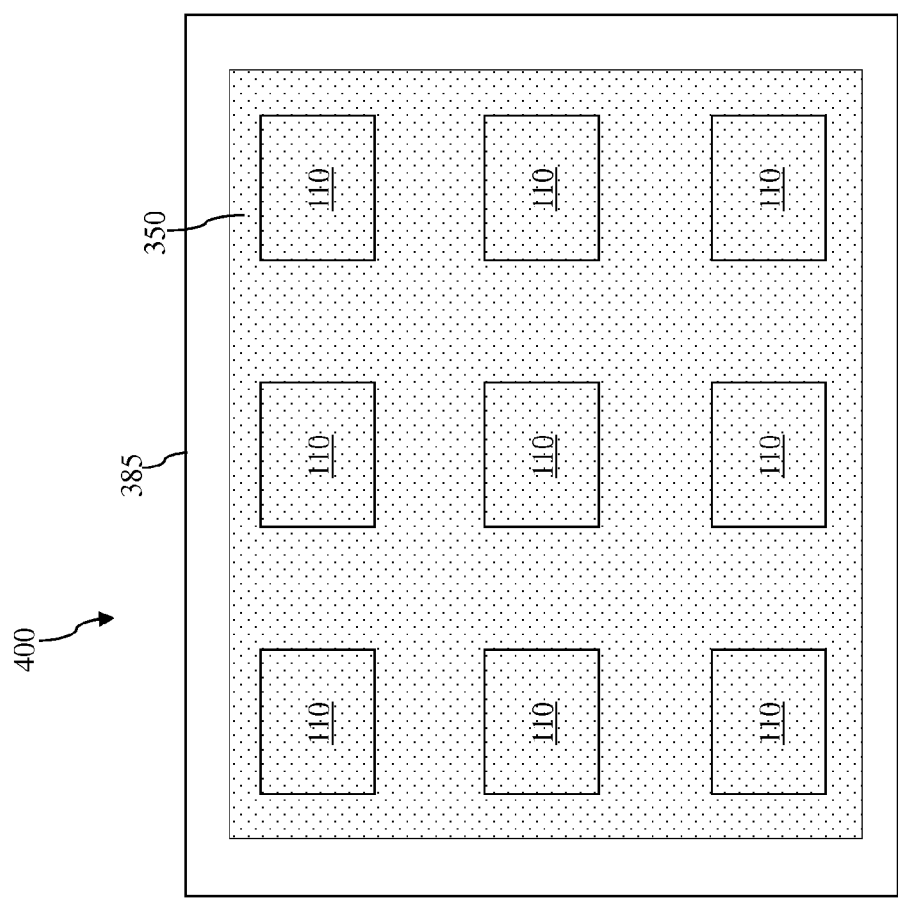

FIG. 21 illustrates a simplified diagrammatic top view of yet another LED lighting module 400 having a plurality of LED dies 110 arranged in a matrix (i.e., rows and columns). These LED dies 110 have been singulated without dicing the carrier substrate. Furthermore, these LED dies 110 may be formed as an array of LEDs. In other words, in the dicing process, these LED dies 110 are kept together (no dicing to separate them from one another), while they are collectively separated from other LED arrays. A phosphor film 350 may be collectively applied to all of the LED dies 110 before the dicing process. After the dicing process, the array of LED dies collectively is coated around with the phosphor film 350. The LED dies 110 may then be placed on the board 385, such as a PCB.

Similarly, if LED dies 110 disposed on a board 385 are in the shape of a matrix, with the transmitting or diffusing housing (for example a housing similar to the housing 387 of FIG. 19B) a luminaire of light bulbs (including MR series bulbs), par light, or down light incorporating light module 390 or 200 can easily be formed, too. For reasons of simplicity, the specific types of luminaires are not specifically illustrated herein.

Figure 22:
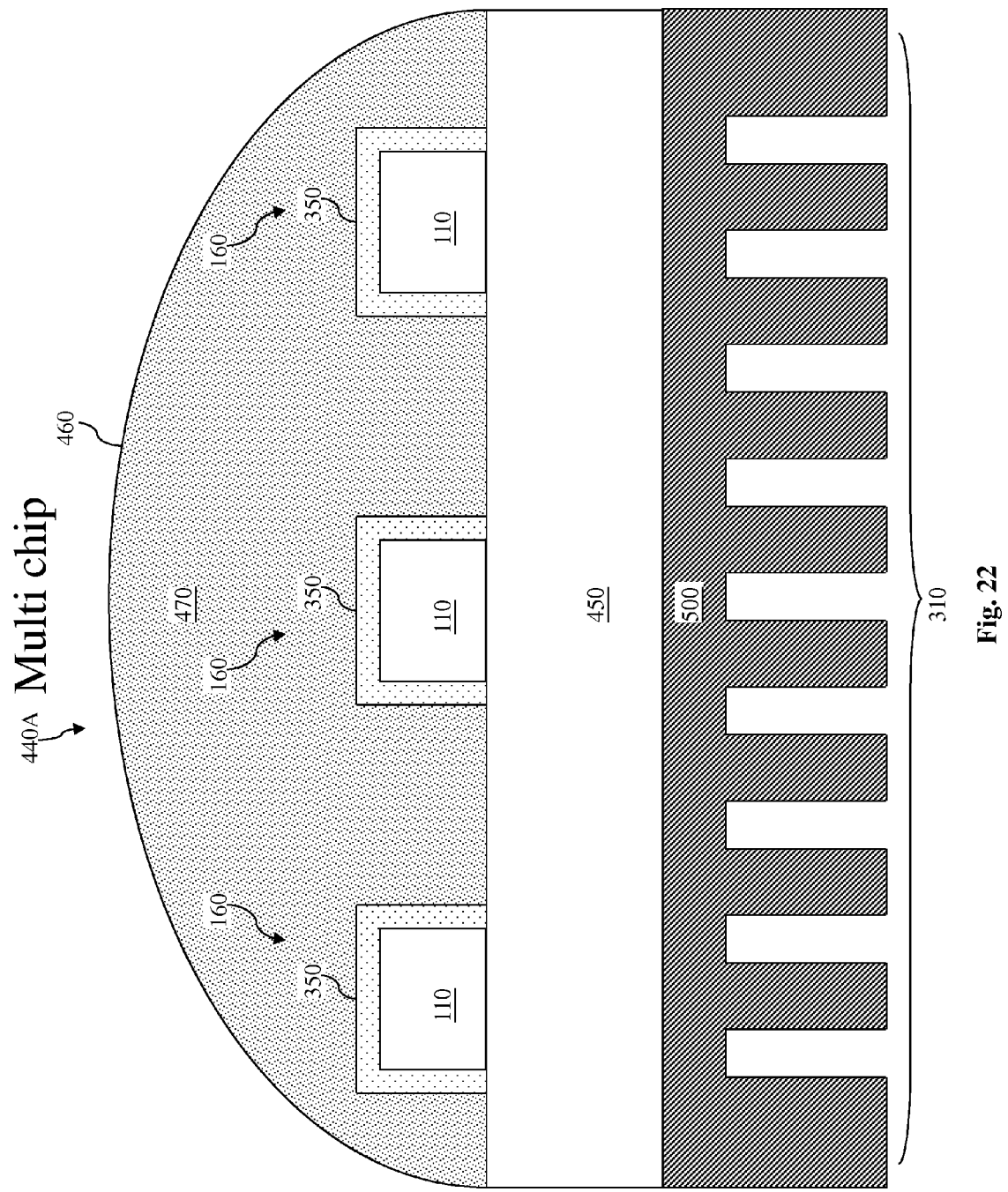
FIG. 22 is a diagrammatic fragmentary cross-sectional side view of an example lighting apparatus according to various aspects of the present disclosure.

Referring now to FIG. 22, discussed below is an example multi-chip lighting unit 440A using the LED chips 160 according to various embodiments of the present disclosure. The lighting unit 440A includes a support member 450. In some embodiments, the support member 450 includes a Metal Core Printed Circuit Board (MCPCB). The MCPCB includes a metal base that may be made of Aluminum (or an alloy thereof). The MCPCB also includes a thermally conductive but electrically insulating dielectric layer disposed on the metal base. The MCPCB may also include a thin metal layer made of copper that is disposed on the dielectric layer. In other embodiments, the support member 450 may include other suitable materials, for example ceramic, copper, or silicon. The support member 450 may contain active circuitry and may also be used to establish interconnections.

As the name implies, the multi-chip lighting unit 440A includes a plurality of LED dies 110. The LED dies 110 are parts of the single junction phosphor-coated LED chips 160 discussed above. For reasons of simplicity, the conductive terminals of the LED chips 160 are not shown herein. In the embodiments discussed herein, the LED dies 110 are physically spaced apart from one another.

The lighting unit 440A also includes a diffuser cap 460. The diffuser cap 460 provides a cover for the LED dies 110 located on the support member 450. Stated differently, the LED dies 110 may be encapsulated by the diffuser cap 460 and the support member 450 collectively. The support member 450 may or may not be completely covered by the diffuser cap 460. In some embodiments, the diffuser cap 460 has a curved surface or profile. In some embodiments, the curved surface may substantially follow the contours of a semicircle, so that each beam of light emitted by the LED dies 110 may reach the surface of the diffuser cap 460 at a substantially right incident angle, for example, within a few degrees of 90 degrees. The curved shape of the diffuser cap 460 helps reduce Total Internal Reflection (TIR) of the light emitted by the LED dies 110. In some embodiments, the diffuser cap 460 has a textured surface for further scattering of the incident light.

In some embodiments, the space between the LED dies 110 and the diffuser cap 460 may be filled by an optical-grade silicone-based adhesive material 470, also referred to as an optical gel 470. Diffuser particles may be mixed within the optical gel 470 in these embodiments so as to further diffuse light emitted by the LED dies 110. In other embodiments, the space between the LED dies 110 and the diffuser cap 460 may be filled by air.

The support member 450 is located on a thermal dissipation structure 500, also referred to as a heat sink 500. The heat sink 500 is thermally coupled to the LED dies 110 through the support member 450. The heat sink 500 is configured to facilitate heat dissipation to the ambient atmosphere. The heat sink 500 contains a thermally conductive material, such as a metal material. The shape and geometries of the heat sink 500 may be designed to provide a framework for a familiar light bulb while at the same time spreading or directing heat away from the LED dies 110. To enhance heat transfer, the heat sink 500 may have a plurality of fins 510 that protrude outwardly from a body of the heat sink 500. The fins 510 may have substantial surface area exposed to ambient atmosphere to facilitate heat transfer. In some embodiments, a thermally conductive material may be disposed between the substrate and the heat sink 500. For example, the thermally conductive material may include thermal grease, metal pads, solder, etc. The thermally conductive material further enhances heat transfer from the LED dies 110 to the heat sink 500.

Figure 23:
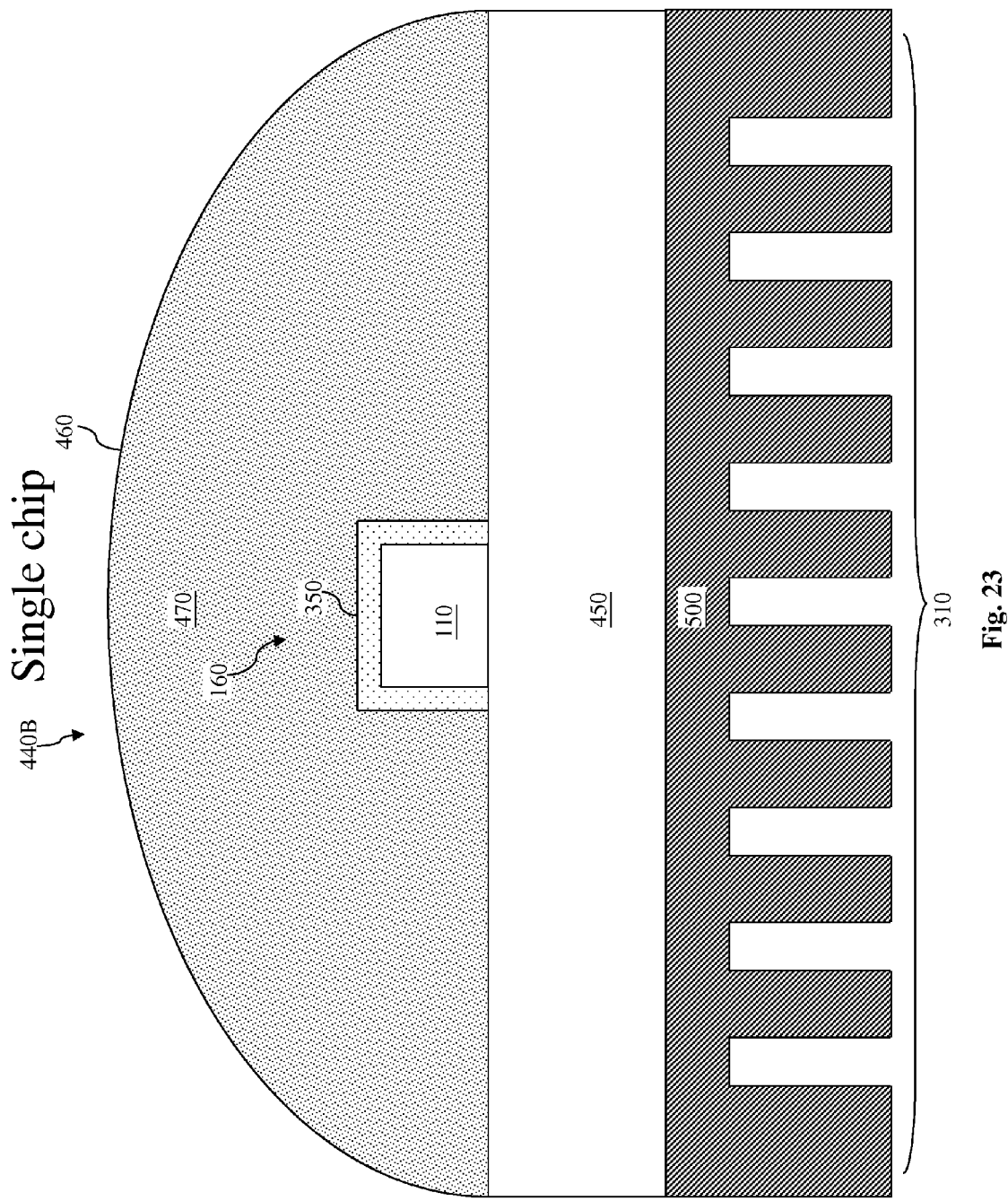
FIG. 23 is a diagrammatic fragmentary cross-sectional side view of another example lighting apparatus according to various aspects of the present disclosure.

In addition to a multi-chip lighting instrument, the concepts of the present disclosure may also apply to a single-chip lighting unit, for example a single-chip lighting unit 440B shown in FIG. 23. Instead of using a plurality of LED chips 160 as light sources (such as the multi-chip lighting instrument 240A of FIG. 22), the single-chip lighting unit 440B includes a single LED chip 160 to generate light. Similar to the multi-chip lighting unit 440A, the single-chip lighting unit 240B includes a support member 450 for housing additional electronic circuitry and providing interconnections, a diffuser cap 460 for optical considerations, an optical gel 470 disposed between the diffuser cap 460 and the support member 450, and a heat sink 500 for thermal dissipation. The single-chip lighting unit 440B may include additional components for facilitating light output, but these additional components are not discussed in detail herein for reasons of simplicity.

Figure 24:
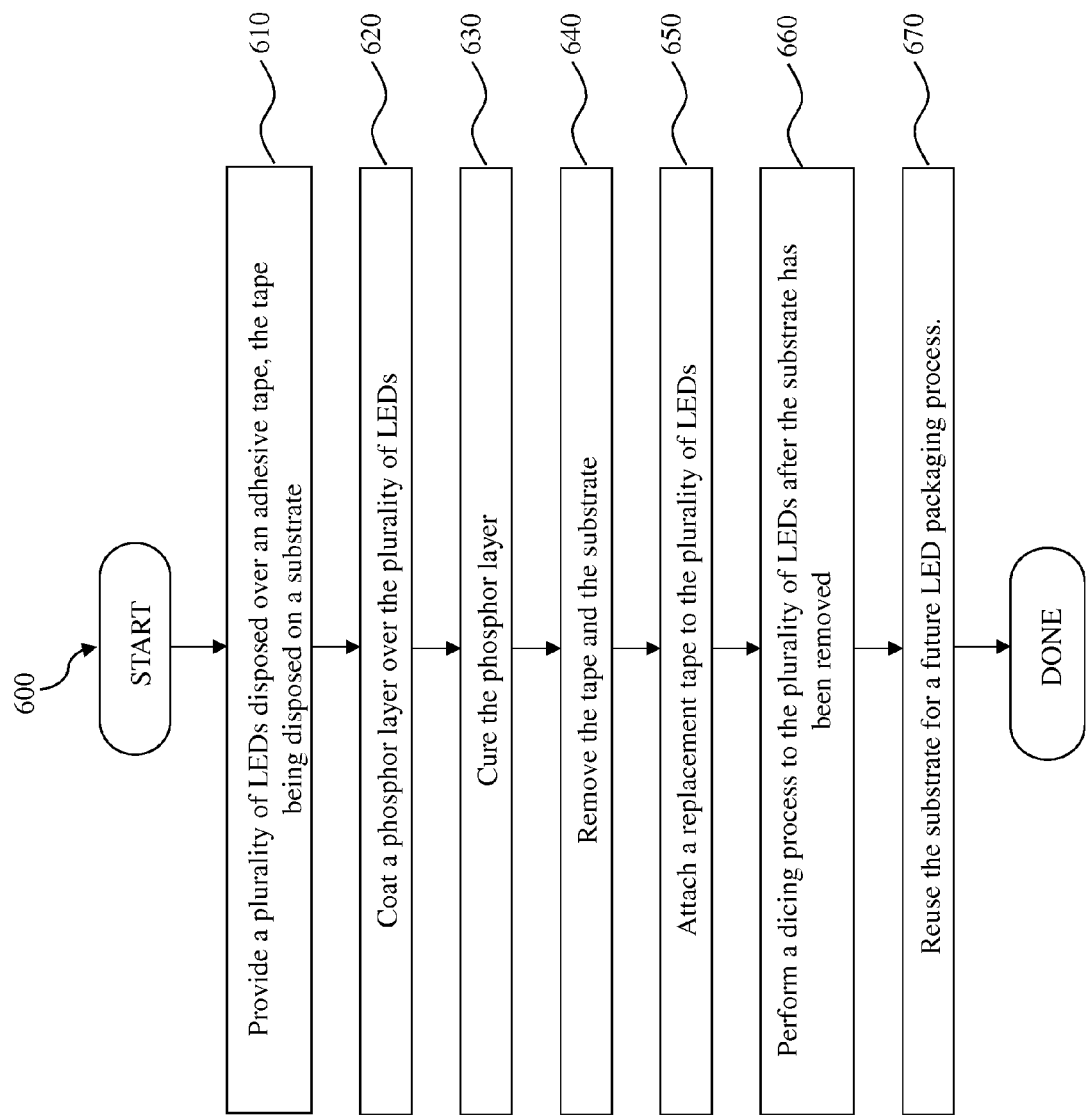
FIG. 24 is a flowchart illustrating a method of packaging an LED according to various aspects of the present disclosure.

FIG. 24 is a flowchart of a method 600 for packaging an LED according to various aspects of the present disclosure. The method 600 includes a step 610, in which a plurality of LEDs is provided. The LEDs are disposed over an adhesive tape. The tape is disposed on a substrate. In some embodiments, the substrate includes one of: a glass substrate, a silicon substrate, a ceramic substrate, and a gallium nitride substrate. In some embodiments, the LEDs are selected from a group of LEDs that are associated with a plurality of bins. The plurality of LEDs that are selected all belong to a subset of the plurality of bins.

The method 600 includes a step 620, a phosphor layer is coated over the plurality of LEDs. The phosphor layer may include a yellow phosphor or a combination of yellow and red phosphor particles. The phosphor particles may be mixed in a viscous fluid. In some embodiments, the viscous fluid may also contain diffuser particles.

The method 600 includes a step 630, in which the phosphor layer is cured. The curing of the phosphor layer helps it maintain a desired shape. In some embodiments, the curing is performed at a high temperature, for example a temperature in a range from about 130 degrees Celsius to about 170 degrees Celsius.

The method 600 includes a step 640, in which the tape and the substrate are removed.

The method 600 includes a step 650, in which a replacement tape is attached to the plurality of LEDs.

The method 600 includes a step 660, in which a dicing process is performed to the plurality of LEDs after the substrate has been removed. Therefore, the dicing process does not involve dicing the substrate.

The method 600 includes a step 670, in which the removed substrate is recycled or reused for a future LED packaging process. In other words, the removed substrate can be used as a carrier substrate for a different plurality of LEDs that need to be packaged.

Additional processes may be performed before, during, or after the blocks 610-670 discussed herein to complete the fabrication of the lighting apparatus. For example, in some embodiments, the method 600 may include a step of molding the phosphor layer such that the phosphor layer has a plurality of segments that each have a dome-like profile or a concave V-shape, U-shape, or W-shape profile. Each of these segments is disposed over a respective one of the LEDs. These segments serve as lenses for the LEDs underneath. For reasons of simplicity, other additional processes are not discussed herein.

Figure 25:
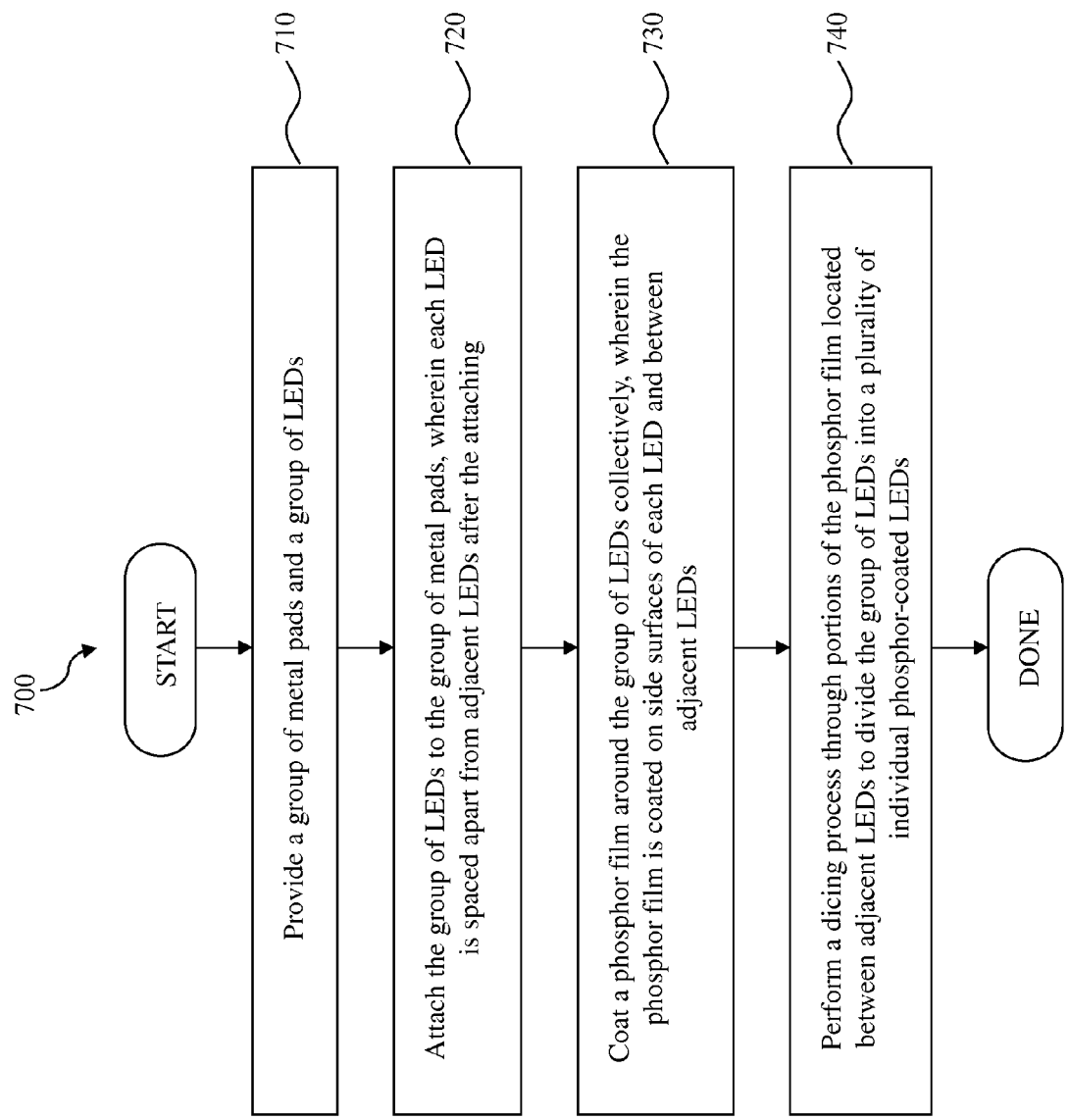
FIG. 25 is a flowchart illustrating a method of packaging an LED according to various aspects of the present disclosure.

FIG. 25 is a flowchart of a method 700 for packaging an LED according to various aspects of the present disclosure. The method 700 includes a step 710, in which a group of metal pads and a group of LEDs are provided. In some embodiments, the group of LED is provided by: obtaining a plurality of LEDs, followed by assigning the plurality of LEDs into different bins according to their performance characteristics, and then choosing one or more bins of LEDs as the group of LEDs. In some embodiments, the metal pads are lead frames.

The method 700 includes a step 720, in which the group of LEDs is attached to the group of metal pads. Each LED is spaced apart from adjacent LEDs. In some embodiments, the step 720 is performed so that each LED is attached to two of the respective metal pads that are physically separated from each other. For each LED, one of the two metal pads is attached to a p-terminal of the LED, and the other one of the two metal pads is attached to an n-terminal of the LED.

The method 700 includes a step 730, in which a phosphor film is coated around the group of LEDs collectively. The phosphor film is coated on top and side surfaces of each LED and between adjacent LEDs. The method 700 includes a step 740, in which a dicing process is performed to dice through portions of the phosphor film located between adjacent LEDs, so as to divide the group of LEDs into a plurality of individual phosphor-coated LEDs.

Additional processes may be performed before, during, or after the blocks 710-740 discussed herein to complete the fabrication of the lighting apparatus. For the sake of simplicity, these additional processes are not discussed herein.

FIGS. 26-36 are simplified diagrammatic cross-sectional side views and perspective views of one or more LEDs at various stages of a substrate-less packaging process according to some embodiments of the present disclosure. For reasons of consistency and clarity, similar components appearing in FIGS. 1-36 will be labeled the same.

Figure 26:
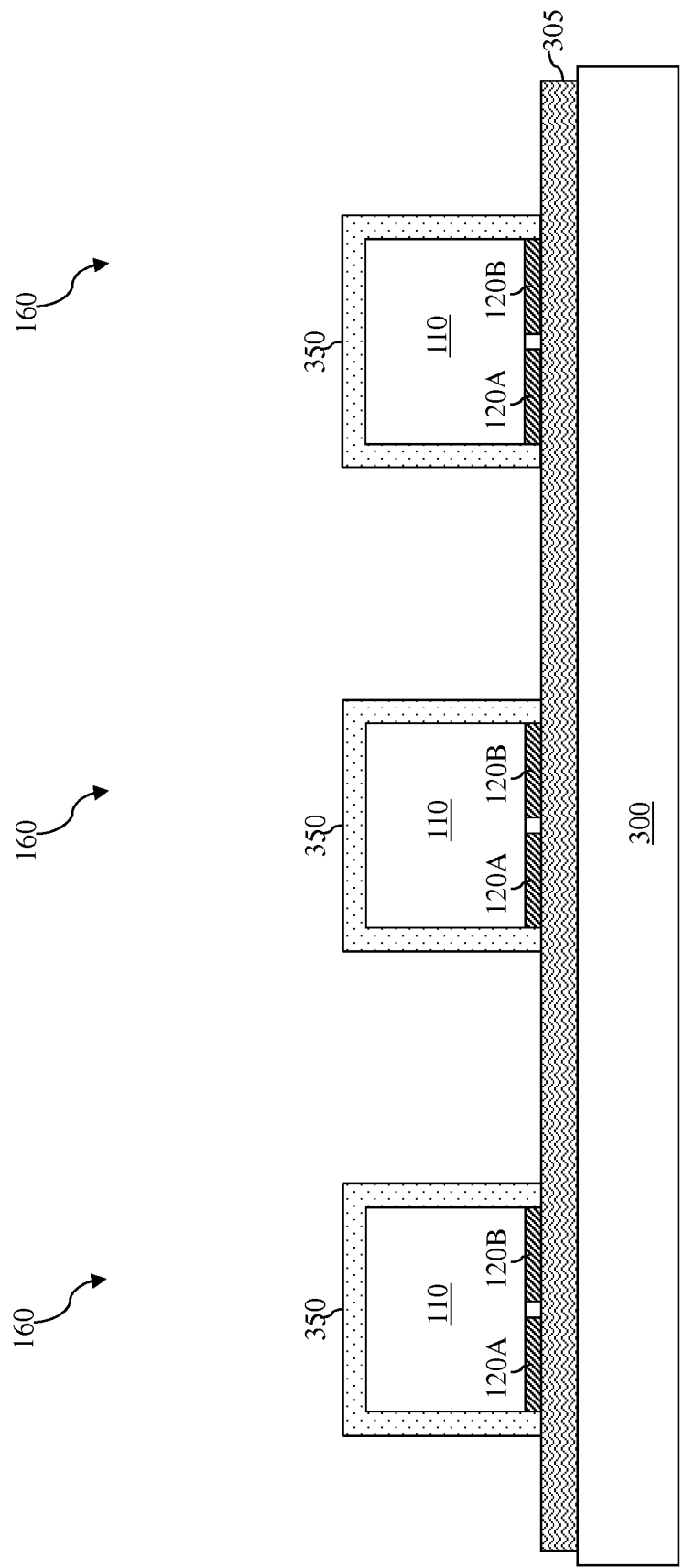
FIGS. 26-33 and 35-36 are diagrammatic fragmentary cross-sectional side views of one or more LEDs undergoing a packaging process according to various embodiments of the present disclosure.

Referring to FIG. 26, the plurality of LED chips 160 is provided. The LED chips 160 have already undergone the phosphor-coating and dicing processes discussed above with reference to FIGS. 9-13. A carrier substrate 300 is also provided. As discussed above, the carrier substrate 300 may include a glass substrate, a silicon substrate, a ceramic substrate, a gallium nitride substrate, or any other suitable substrate that can provide mechanical strength and support. In some embodiments, the carrier substrate 300 is the same substrate 300 that was used in the phosphor coating of the LED chips 160 and that was removed in FIG. 11. In other embodiments, the carrier substrate 300 is a substrate similar to the carrier substrate 300 that was removed in FIG. 11, but not the same.

The LED chips 160 are attached to the substrate 300 through a tape 305. In some embodiments, the tape 305 may be a double-sided tape. In other embodiments, instead of using the tape 305, an adhesive material or a photoresist material may be used to help attach the LED chips 160 to the substrate 300.

Figure 27:
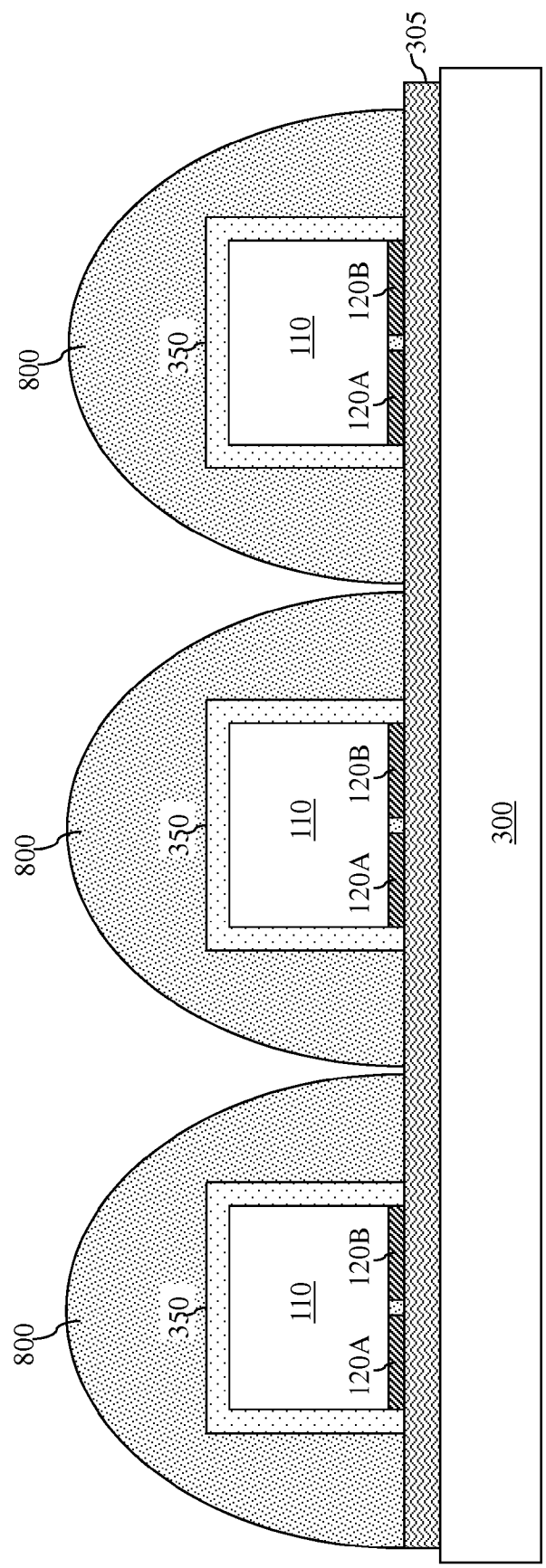

Referring now to FIG. 27, a plurality of lenses 800 are formed. In some embodiments, the lenses 800 are formed by a molding process. For example, a gel may be applied over the substrate 300 and then molded by a molding apparatus similar to the molding stencil 370 shown in FIG. 15. In some embodiments, the gel can be a high transmittance material, for example a material having a transmittance that is greater than about 90%. The gel material may also have a suitable refractive index, for example a refractive index in a range from about 1.4 to about 2. Diffuser particles may also be added to, or mixed within, the gel. In some embodiments, the diffuser particles have a refractive index in a range from about 1.4 to about 2. The diffuser particles may include, as non-limiting examples, silica, pmma, $ZrO_2$, or silicon. After being molded, the gel material may also be cured.

As a result of being shaped by the molding apparatus and being cured, an upper surface of each of the lenses 800 may achieve any desired profile. In the embodiment shown in FIG. 27, the lenses 800 may each have a convex dome-like profile. In other words, for each lens 800, there is a portion of the upper surface that is substantially rounded and curved. In some embodiments, the lenses 800 are shaped as a hemisphere or a semi-ellipsoid. Such geometric configurations of the lenses help focus light emitted by the LED dies 110 underneath.

Figure 28:
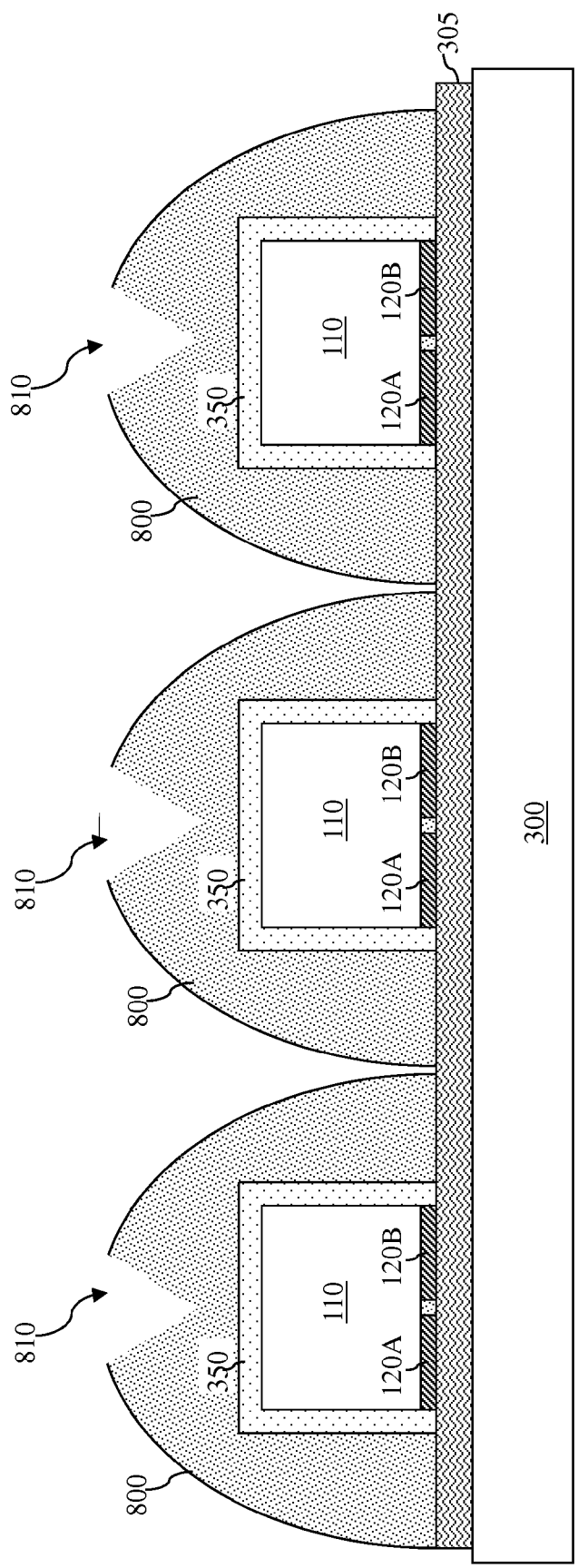
Figure 29:
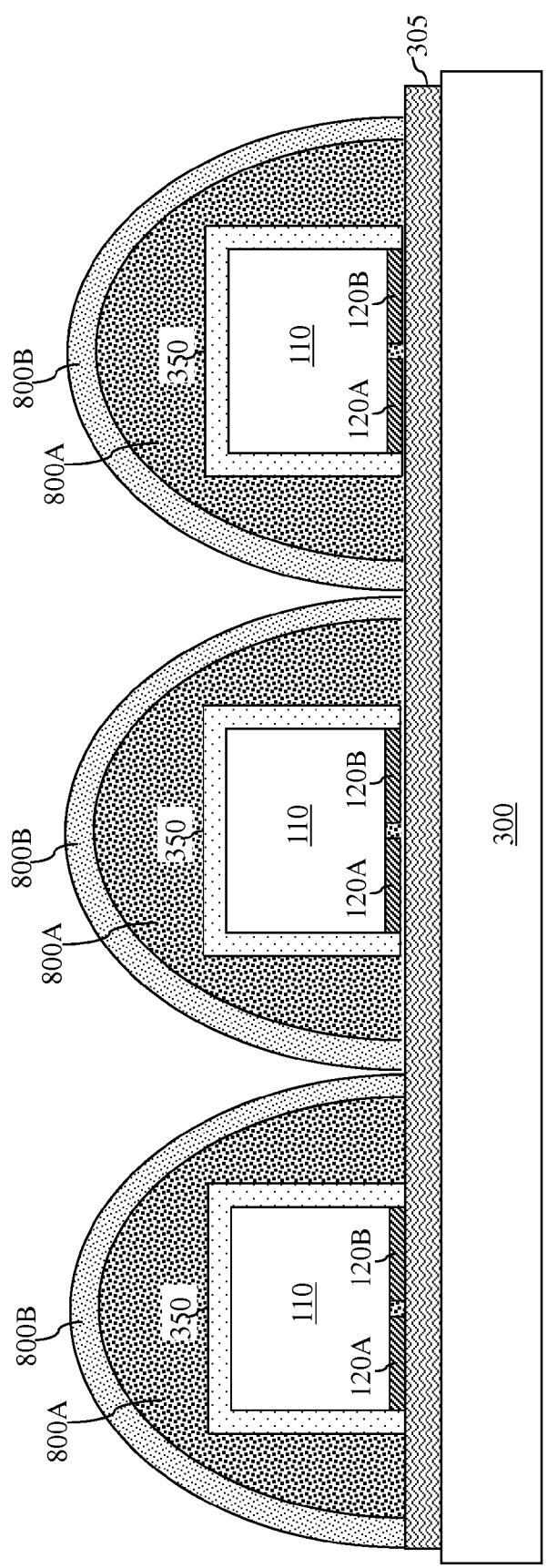

It is understood that the dome-like profile for the lenses 800 is merely an example. In other embodiments, different profiles may be formed for the lenses 800 to achieve different optical purposes. For example, FIG. 28 illustrates a different geometric profile for the lenses 800. In the embodiment shown in FIG. 28, the lenses 800 each include a recess 810 located over the LED die 110, so that the lenses 800 may achieve a "batwing-like" design. In the embodiment shown in FIG. 28, the recess 810 may resemble an inverted cone, which correspondingly has a cross-sectional profile that resembles an inverted triangle. The specific geometries and dimensions of the cone (or triangle in the cross-sectional view) may be tuned by configuring the molding apparatus appropriately. In yet other embodiments, the lenses 800 may be shaped differently to achieve other geometric profiles. For example, the lenses 800 may be shaped to have a concave W-shaped profile or a concave U-shaped profile in other alternative embodiments.

The lenses 800 may also be formed to have specific dimensions. This may be achieved by configuring the dimensions of the molding apparatus, for example. In some embodiments, the lenses 800 are taller (i.e., vertically) than their respective LED dies by greater than about 100 microns. In some embodiments, the lenses 800 are wider (i.e., laterally or horizontally) than their respective LED dies by greater than about 15 microns.

It is also understood that the lenses 800 may also be formed to have multiple layers. For example, referring now to FIG. 29, the lenses 800 may each include a sub-layer 800A and a sub-layer 800B disposed over the sub-layer 800A. In some embodiments, the sub-layer 800A is mixed with phosphor particles but not diffuser particles, and the sub-layer 800B is mixed with diffuser particles but not phosphor particles. In other embodiments, the sub-layer 800B is mixed with phosphor particles but not diffuser particles, and the sub-layer 800A is mixed with diffuser particles but not phosphor articles. The sub-layers 800A and 800B may also each be mixed with different color phosphor particles. For example, the sub-layer 800A may be mixed with yellow phosphor particles, and the sub-layer 800B may be mixed with red phosphor particles, or vice versa. In further alternative embodiments, the lenses 800 may include more than two sub-layers that may each have its own characteristics or material compositions, although these embodiments are not specifically illustrated herein for reasons of simplicity.

Figure 30:
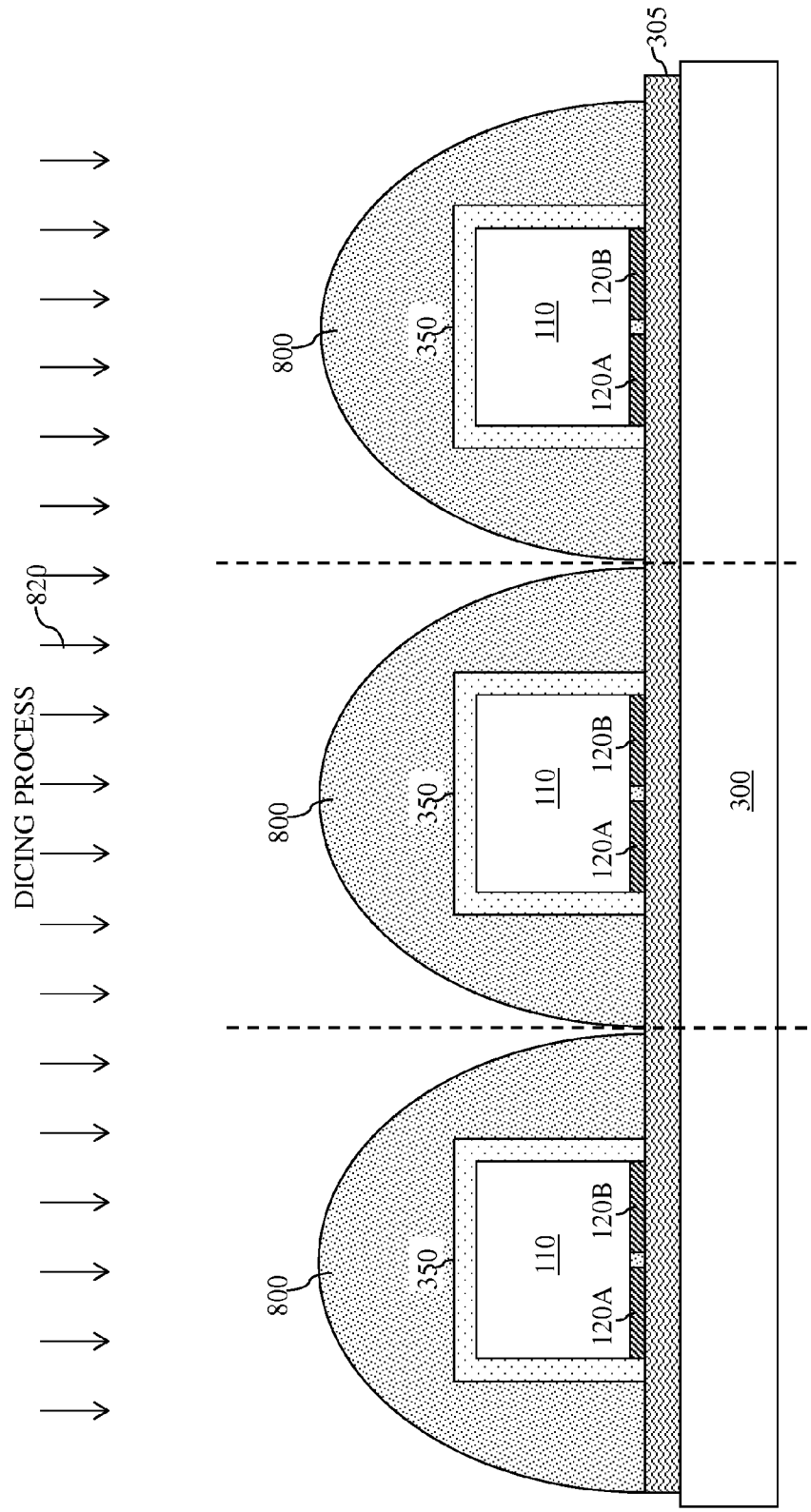

Regardless of how the lenses 800 are molded, a dicing process is performed to separate adjacent LED dies 110 (with their respective lenses 800 formed thereon) from other adjacent LED dies. An embodiment of the dicing process is illustrated in FIG. 30 as dicing or singulation process 820. In some embodiments, the dicing process 820 may involve the use of a mechanical sawing blade. In other embodiments, the dicing process 820 may involve the use of a laser.

Figure 31:
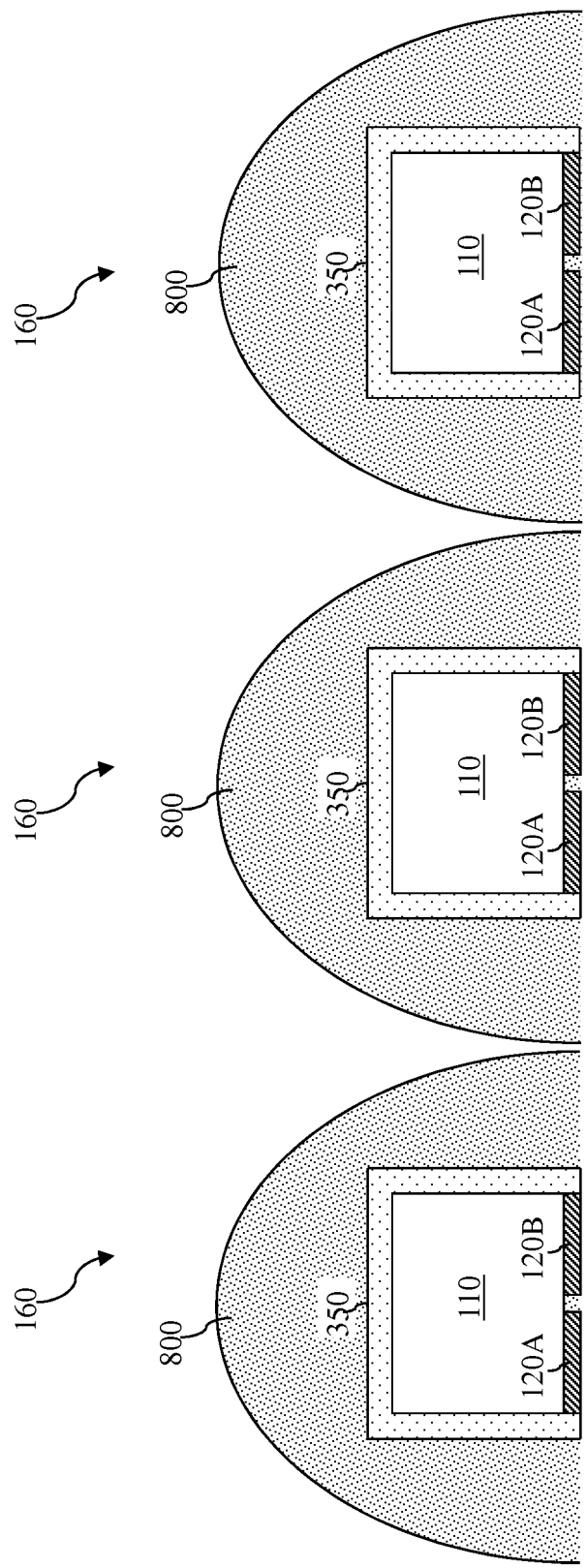
Figure 32:
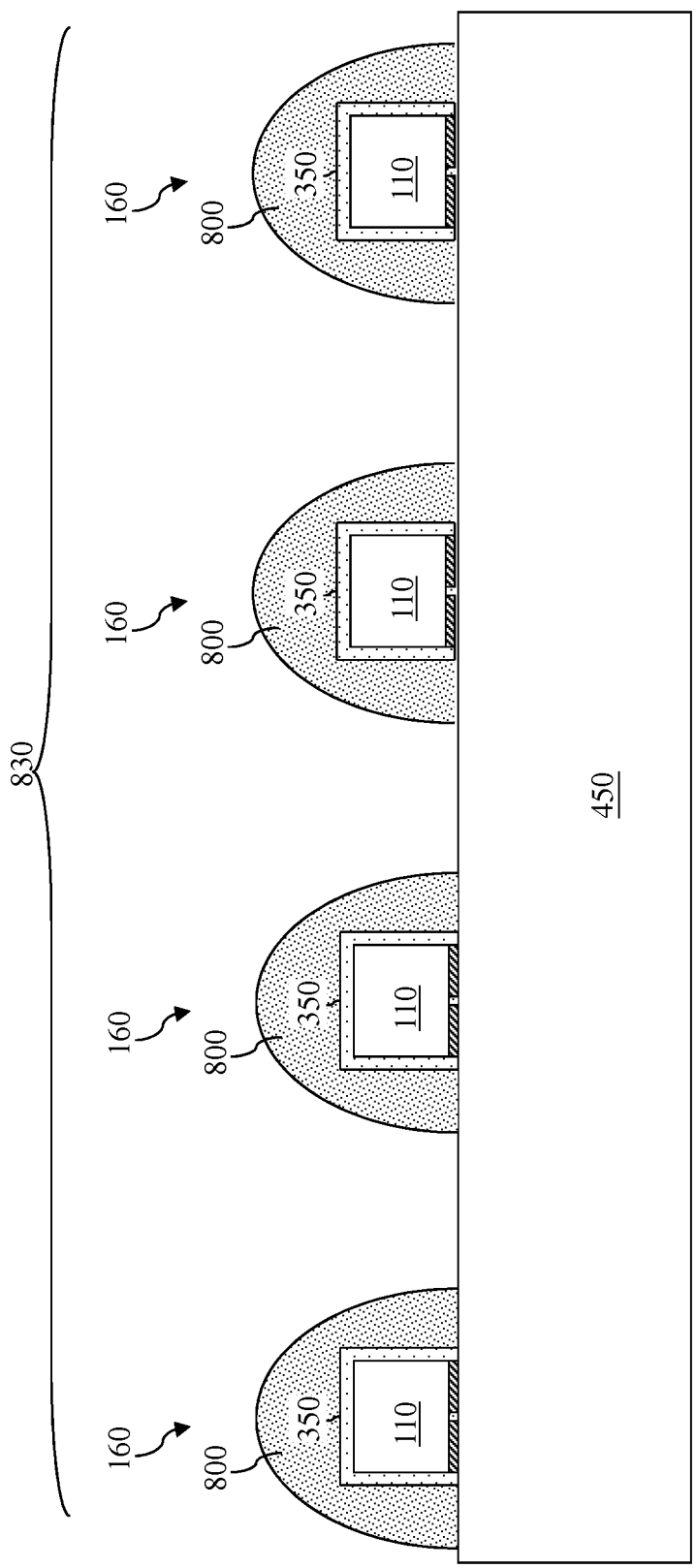

Referring now to FIG. 31, the tape 305 and the substrate 300 are removed. This may be referred to as a de-taping process. In some embodiments, the de-taping process may also involve replacing the removed tape 305 with a new tape. In other embodiments, the tape 305 need not be removed. As a result of the singulation and de-taping processes, individual LED chips 160 are formed. It is understood that the singulation process 820 need not be performed before the de-taping process. In some embodiments, the de-taping process may be performed first to remove the substrate 300 and/or the tape 305, and thereafter the singulation process 820 may be performed to separate adjacent LED dies 110 from one another. By doing so, the removed substrate 300 may be reused for future fabrication/packaging processes, thereby reducing packaging time and cost.

The singulated LED chips 160 (with the lenses 800 formed thereon) shown in FIG. 31 may be referred to as single junction LED chips. However, the concepts of the present disclosure may also apply to multi-junction LED chips discussed above and shown in FIG. 19A/B and 20-22. In this manner, a matrix of LED dies (containing one or more rows and one or more columns of LED dies) may be formed as part of a lighting module, for example a lighting module 830 shown in FIG. 32. The lighting module 830 includes a row of LED chips 160 that are bonded to a substrate 450 (i.e., the support member 450 discussed above with reference to FIGS. 22-23), which may include a MCPCB in some embodiments. In other embodiments, the substrate 450 may include a copper substrate or a ceramic substrate. The lighting module 830 may also include a heat sink (not shown herein), such as the heat sink 500 in FIGS. 22-23. The lighting module 830 may be implemented in a suitable lighting product, such as an indoor A lamp, a T-5 tube, a T-8 tube, etc. The lighting product may be configured to have a single color temperature (CCT) or a combination of color temperatures, for example by tuning the wavelength of the light emitted by one or more of the LED dies 110 and/or tuning the material compositions of the phosphor particles in the film 350 and/or the lenses 800.

Due to the unique fabrication process flow of the present disclosure discussed above, the LED chips 160 formed herein have various structural differences compared to conventional LED chips. For example, referring to FIG. 33, a more detailed cross-sectional view of an LED chip 160 is illustrated according to some embodiments of the present disclosure. The LED chip 160 includes an LED die 110 and a phosphor film 350 coated on the top surface and side surfaces of the LED die 110. As discussed above, the phosphor film 350 is formed by applying a phosphor-containing material (e.g., a gel) on a plurality of LED dies 110 and thereafter singulating the LED dies by a dicing process. The phosphor film 350 coated around each LED die 110 has side surfaces 850 and a top surface 851. Due to the dicing process, the side surfaces 850 of the phosphor film 350 are substantially planar or flat. For example, the planar or flat side surfaces 850 of the phosphor film 350 may be defined by a mechanical sawing blade or a concentrated laser beam used to carry out the dicing process. In comparison, the phosphor film coated around conventional LED dies may not have flat side surfaces, since the phosphor material is typically coated on each LED die individually and does not undergo the dicing process discussed above. As a result, conventional LED dies may have more rounded or curved side surfaces.

Compared to the side surfaces 850, the top surface 851 of the LED chip 160 is not as flat or planar, since the top surface 851 is not defined by a dicing process. For example, in some embodiments, the top surface 851 has a surface topography variation of about ±50 microns, whereas the side surfaces 850 has a surface topography variation of about ±5 microns. To the human eye, the top surface 851 may appear as a substantially flat surface. But when examined closely by a machine (e.g., under a microscope, etc.), the different surface roughness characteristics between the top surface 851 and the side surfaces 850 of the phosphor film 350 will become apparent. Again, these different roughness characteristics are a consequence of the unique fabrication process flow discussed herein. The side surfaces 850 are formed by dicing of cutting, and thus the side surface roughness is defined at least in part by the planarity of the blade (or laser) used to perform the cutting. On the other hand, the top surface 851 is not formed by a cutting or dicing process but by deposition, and thus the top surface roughness is defined by the phosphor deposition processes. Thus, in addition to the differences in topography variations discussed above between the top and side surfaces 851 and 850, there may be other distinguishable differences that are not necessarily visible to a human eye but are clearly identifiable when examined closely using a machine.

Figure 33:
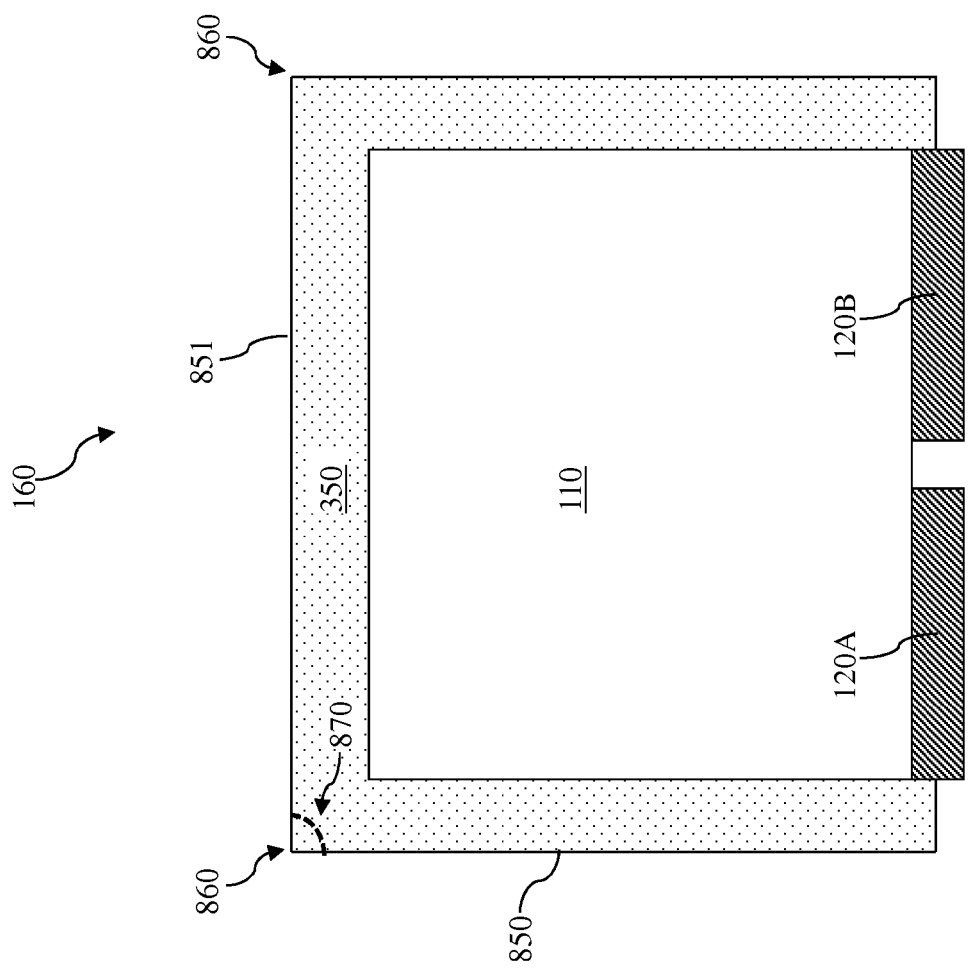
Figure 34:
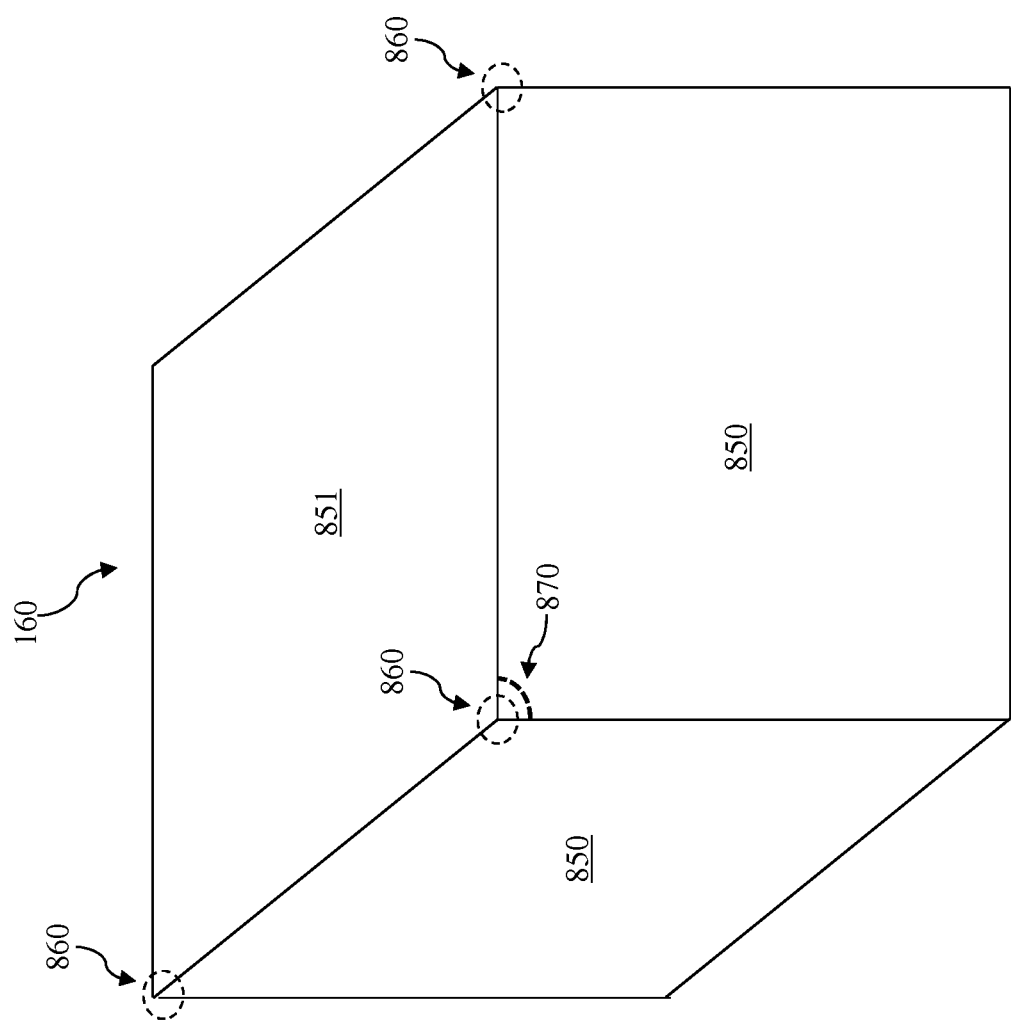
FIG. 34 is a diagrammatic perspective view of an LED die according to various embodiments of the present disclosure.

In addition to the planar of flat side surfaces 850, the phosphor film 350 of the embodiment of the LED chip 160 shown in FIG. 33 has one or more sharp or angular corners 860 that are located above the LED die 110. These angular corners 860 are defined by the side surfaces 850 and the top surface 851. A simplified three-dimensional (3D) perspective view of the angles 860 is illustrated in FIG. 34 to facilitate a better understanding of the present disclosure. In more detail, FIG. 34 is a simplified 3-D perspective view of a phosphor-coated LED die. Thus, the surfaces shown in FIG. 34 are surfaces of the phosphor film 350. As can be seen, each angular corner 860 is defined by the substantially straight edges of the side surfaces 850 and the edges of the top surface 851 of the phosphor film. In some embodiments, the corner 860 may include a pointy vertex, or an apex, which is an intersection of the edges of the top and side surfaces 851/850. Again, such sharp or angular corners 860 of the present disclosure is a result of the unique fabrication process flow discussed above, for example a result of the dicing process used to singulate the phosphor-coated LED dies. Conventional LED dies may have a phosphor film coated thereon, but due to their fabrication process flows, the phosphor film coated on conventional LED dies are devoid of such angular corners or apexes.

Figure 35:
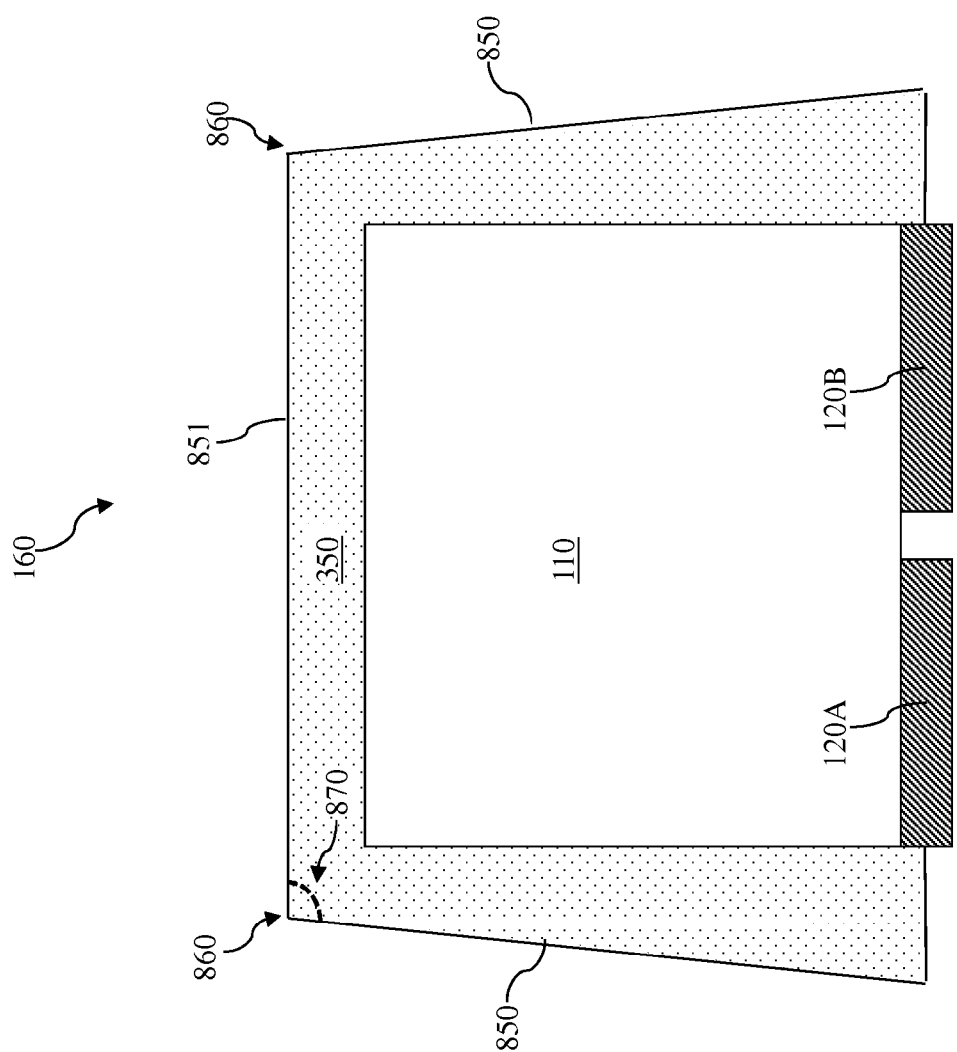

As shown in FIGS. 33-34, the angular corner 860 may have an angle 870. In the embodiment shown in FIGS. 33-34, the angle 870 is about 90 degrees. This corresponds to the dicing process being performed substantially perpendicularly with respect to the top surface 851 of the phosphor film 350. In other words, the dicing process is performed "straight down" without a tilt angle. However, the dicing process may be performed with a tilt angle in some embodiments, which would result in the angle 870 of the corner 860 being greater than about 90 degrees, as is shown in FIG. 35. The angle 870 may range from about 90 degrees to about 135 degrees. It is understood that the specific shape and geometry of the mechanical sawing blade may also contribute to the angle 870 being greater than about 90 degrees.

Figure 36:
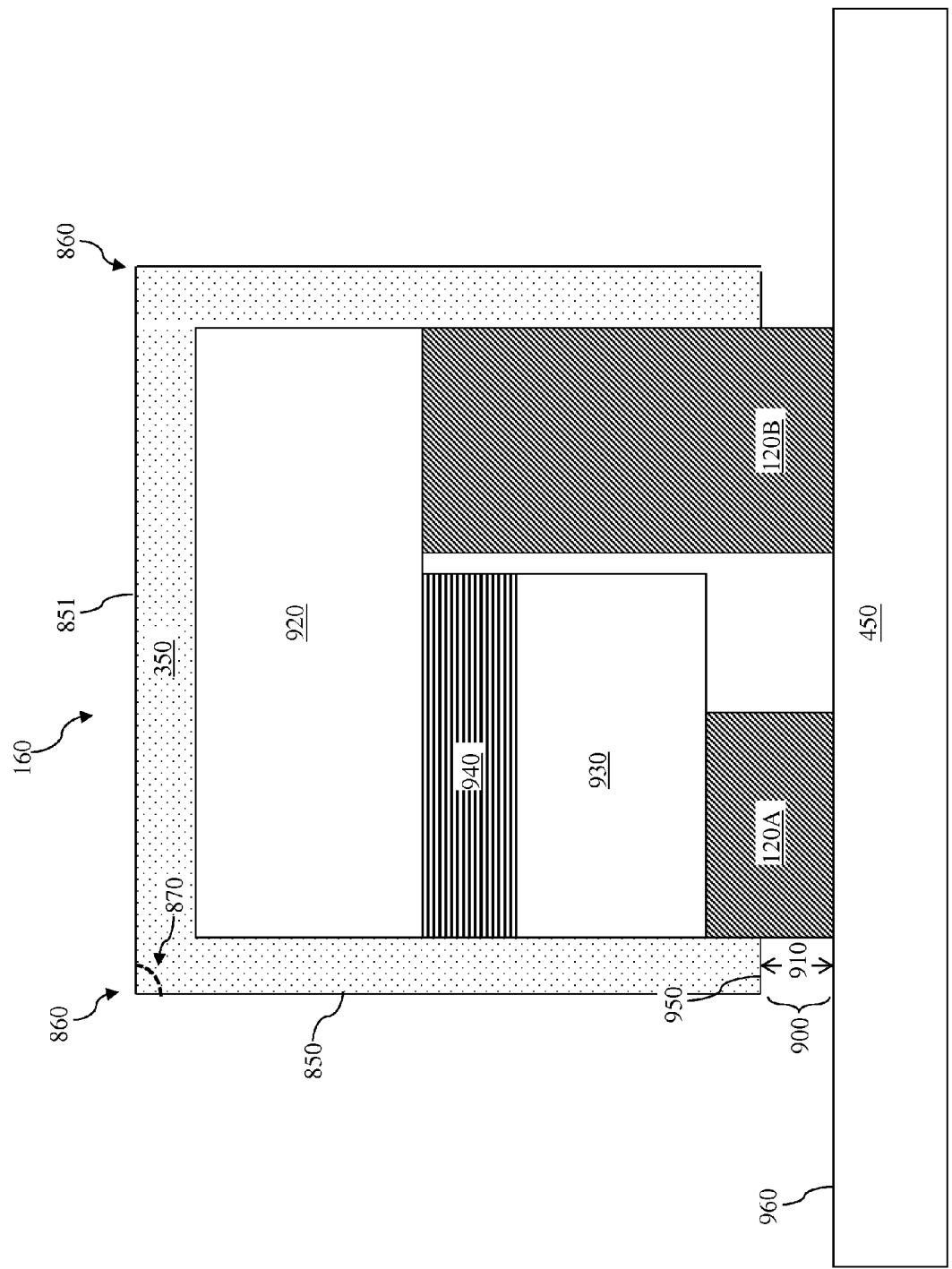

FIG. 36 illustrates another structural difference between the LED chips 160 of the embodiments of the present disclosure and conventional LED chips. Due to the unique fabrication process flow discussed above, a gap 900 will exist between the upper surface of the substrate 450 (for example a MCPCB) and the phosphor film 350. In more detail, the LED chips 160 are bonded to the substrate 450 (e.g., a MCPCB) after the phosphor film 350 has been coated thereon. To facilitate the bonding of the LED chips to the substrate 450, solder is applied on the upper surface of the substrate 450 and undergoes a solder reflow process. In other words, solder serves as a physical and electrical interface between each LED chip 160 and the substrate 450. This solder material has a certain height, however, and it is the height of the solder material that contributes to the gap 900. For reasons of simplicity, the solder is not specifically illustrated herein, but it is understood that portions of the conductive terminals 120A/120B include the solder. In comparison, according to conventional methods, a phosphor film is typically coated to LEDs after the LEDs have been attached to a substrate. As such, the phosphor film is applied in a manner such that it comes into contact with the upper surface of the substrate. Hence, there is no gap similar to the gap 900 herein in LEDs fabricated by conventional phosphor coating methods.

As shown in FIG. 36, the gap 900 has a vertical dimension (i.e., height) 910. In some embodiments, the vertical dimension 910 is in a range from about 0.1 micron to about 50 microns, for example in a range from about 40 microns to about 50 microns. Again, since the gap 900 is caused by the height of the solder material that is used to bond the LED chip 160 to the substrate 450, it may be said that the vertical dimension 910 is roughly equal to the height of the solder material. Meanwhile, the phosphor film 350 has a lateral dimension 911 that is in a range from about 60 microns to about 200 microns, for example about from 100 microns to about 150 microns. and the phosphor film 350 also has a vertical dimension 912 that is in a range from about 300 microns to about 1000 microns, for example about from 400 microns to about 600 microns.

In more detail, the LED die includes doped semiconductor layers 920 and 930, and a light-emitting layer 940 disposed between the doped semiconductor layers 920 and 930. In some embodiments, the doped semiconductor layers 920 and 930 contain III-V group compounds, such as GaN. The layers 920 and 930 have different types of conductivity (i.e., one of them is n-doped, and the other is p-doped). The light-emitting layer 940 may include a multiple quantum well (MQW). The conductive terminal 120A is electrically coupled to the doped semiconductor layer 930, while the conductive terminal 120B is electrically coupled to the doped semiconductor layer 920. In various embodiments, the conductive terminals 120A and 120B may each include one or more metal pads, solder, or other types of electrical interconnections. It is understood that the LED die illustrated in FIG. 36 is simplified for reasons of simplicity. For example, the LED die may include additional unillustrated un-doped layers, buffer layers, barrier layers, passivation layers, etc. In addition, the embodiment of the LED die illustrated in FIG. 36 is a horizontal LED die, though some of the concepts of the present disclosure may apply to a vertical LED die as well.

In any case, it can be seen that the gap 900 is defined at least in part by a bottommost surface 950 (from the portion of the phosphor film 350 disposed on side surfaces or sidewalls of the LED die) of the phosphor film 350 and an upper surface 960 of the substrate 450. Stated differently, the bottommost surface 950 of the phosphor film 350 is separated from the substrate 450, and the phosphor film 350 does not completely cover up the side surfaces or sidewalls of the LED die. It may also be said that the bottommost surface 950 is located above the bottom surfaces of the conductive terminals 120A/120B, or the bottommost surface 950 of the phosphor film 350 is located closer (i.e., higher up to the doped semiconductor layer 920 than the bottom surfaces of the conductive terminals 120A/120B). It is understood that although the embodiment shown in FIG. 36 illustrates the sidewalls of the conductive terminals 120A/120B as being substantially co-planar with the sidewalls of the rest of the LED chip 160, it is not necessarily true in other embodiments. For example, in some embodiments, a gap of between about 0.1 microns to about 5 microns may exist between the sidewall of the LED chip 160 and the sidewall of the conductive termals 120A/120B.

Figure 37:
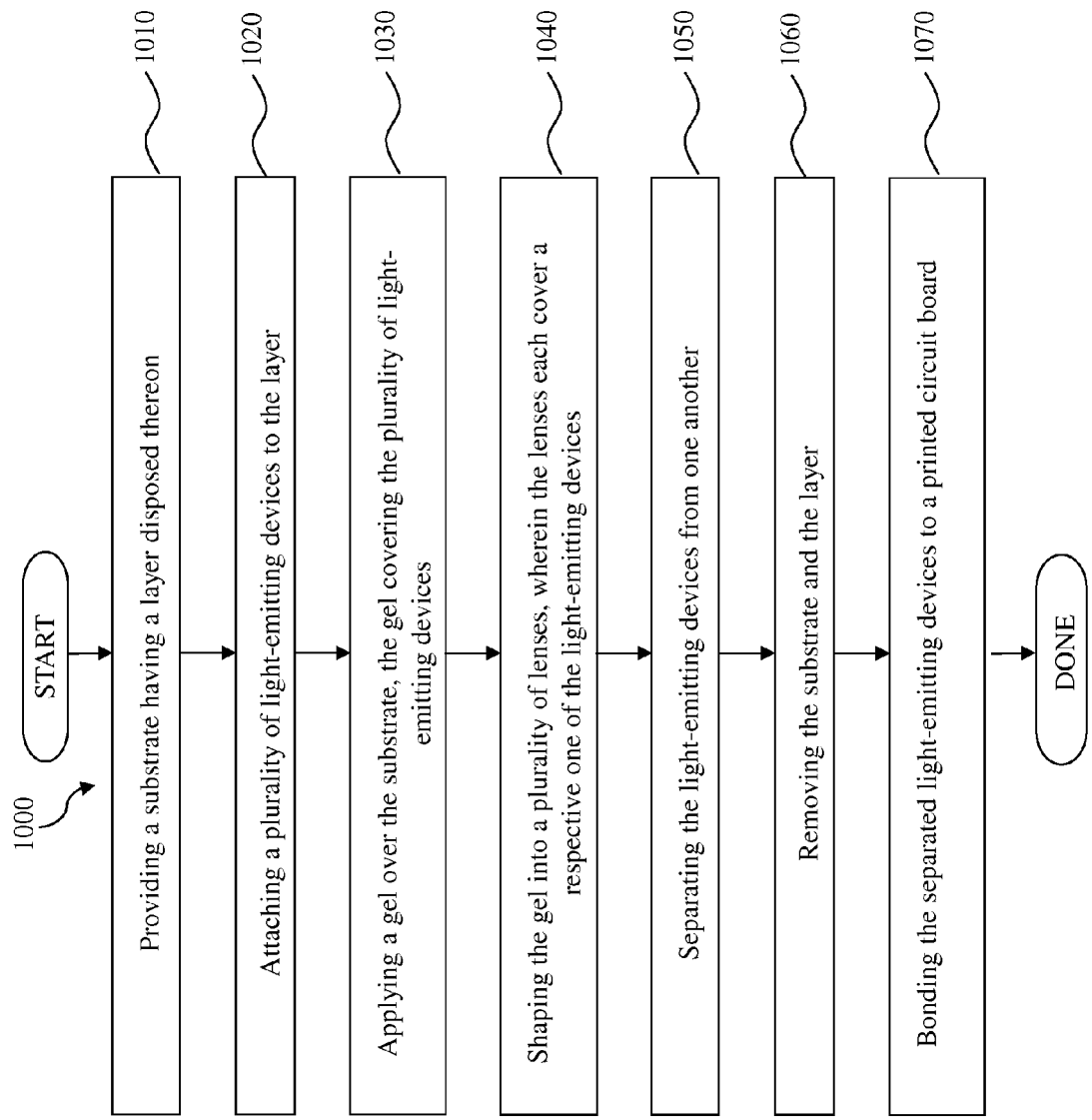
FIG. 37 is a flowchart illustrating a method of packaging an LED according to various embodiments of the present disclosure.

FIG. 37 is a simplified flowchart illustrating a method 1000 of packaging light-emitting devices. The method 1000 includes a step 1010 of providing a substrate having a layer disposed thereon. In some embodiments, the providing of the layer comprises placing a tape on the substrate. In some embodiments, the providing of the layer includes forming a photoresist material on the substrate. In some embodiments, the providing of the layer comprises forming an adhesive layer on the substrate.

The method 1000 includes a step 1020 of attaching a plurality of light-emitting devices to the layer.

The method 1000 includes a step 1030 of applying a gel over the substrate, the gel covering the plurality of light-emitting devices.

The method 1000 includes a step 1040 of shaping the gel into a plurality of lenses, wherein the lenses each cover a respective one of the light-emitting devices.

In some embodiments, the applying of the gel in step 1030 and the shaping of the gel in step 1040 are performed such that: the lenses each include a first sub-layer and a second sub-layer, and the first and second sub-layers have different characteristics. In some embodiments, the first sub-layer contains phosphor particles, and the second sub-layer contains diffuser particles. In some embodiments, the first sub-layer contains first phosphor particles, and the second sub-layer contains second phosphor particles, and the first and second phosphor particles are different color phosphor particles.

The method 1000 includes a step 1050 of separating the light-emitting devices from one another. In some embodiments, the step 1050 includes a dicing process.

The method 1000 includes a step 1060 of removing the substrate and the layer. In some embodiments, the step 1060 includes a de-taping process.

The method 1000 includes a step 1070 of bonding the separated light-emitting devices to a printed circuit board.

It is understood that the steps 1010-1070 are not necessarily performed sequentially unless otherwise specified. For example, the separating of the light-emitting devices may be performed before the removing of the substrate in some embodiments, and the separating of the light-emitting devices is performed after the removing of the substrate in other embodiments. It is also understood that additional steps may be performed before, during, or after the steps 1010-1070 discussed above. For example, before the step 1020 of attaching of the plurality of light-emitting devices, the method 1000 may include a step of coating a phosphor layer on the light-emitting devices. For reasons of simplicity, other steps are not discussed in detail herein.

Figure 38:
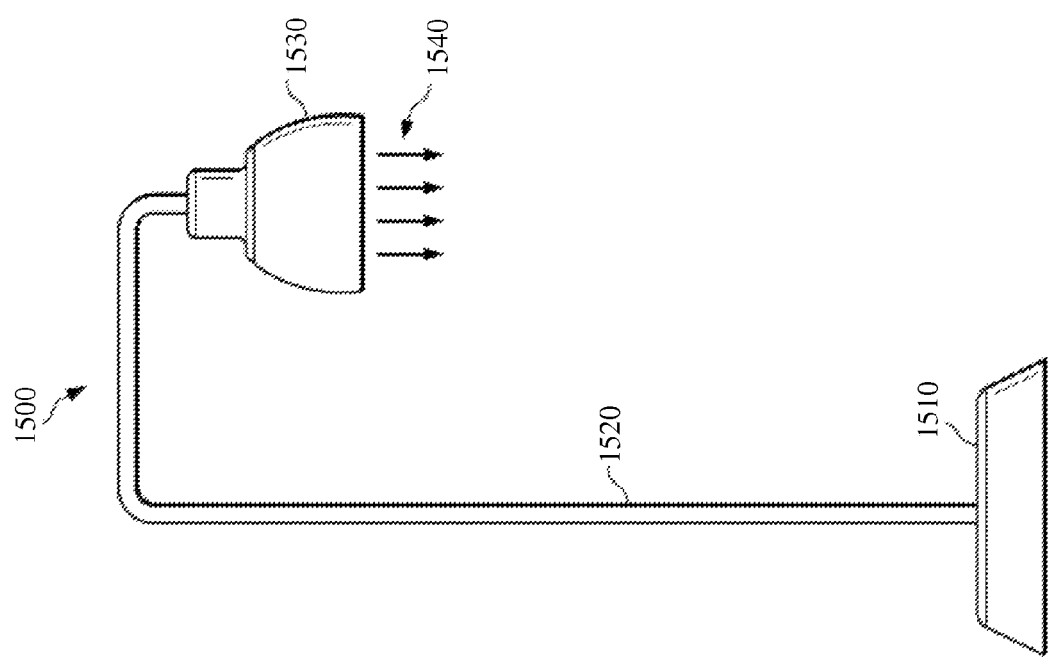
FIG. 38 is a diagrammatic view of a lighting module that includes a plurality of phosphor-coated LED dies according to various embodiments of the present disclosure.

FIG. 38 illustrates a simplified diagrammatic view of a lighting system or lighting apparatus 1500 that includes some embodiments of the LED dies 110 or LED chips 160 discussed above. For example, the LED dies 110 or LED chips 160 may be implemented as a part of the lighting unit 440A discussed above, which can then be implemented in the lighting apparatus 1500. The lighting apparatus 1500 has a base 1510, a body 1520 attached to the base 1510, and a lighting assembly 1530 attached to the body 1520. In some embodiments, the lighting assembly 1530 is a down lamp (or a down light lighting module). In other embodiments, the lighting assembly 1530 may be another type of light, such as a par light or a light tube. The lighting assembly 1530 may be used for in-door lighting or out-door lighting, such as a street lamp or road lamp.

The lighting assembly 1530 can include the lighting unit (e.g., 240A or 240B) or light module (e.g., 380, 390, or 400) discussed above with reference to FIGS. 1-37. In other words, the lighting assembly 1530 of the lighting apparatus 1500 includes an LED-based light source, wherein the LED dies are phosphor coated in a localized manner. The LED packaging for the lighting assembly 1530 is configured to produce a light output 1540. It is also understood that in certain embodiments, light modules not using an optical gel or a diffuser cap may also serve as a light source (e.g., the lighting assembly 1530) for the lighting apparatus 1500.

One of the broader forms of the present disclosure involves a method. The method involves: bonding a plurality of light-emitting dies to a plurality of conductive pads; applying a phosphor material on the plurality of light-emitting dies in a manner such that spaces between adjacent light-emitting dies are filled with the phosphor material; and separating the plurality of light-emitting dies from one another, thereby forming a plurality of phosphor-coated light-emitting dies, wherein each light-emitting die has the phosphor material coated on a top surface and side surfaces of the light-emitting die.

In some embodiments, the bonding is performed so that the plurality of light-emitting dies are physically spaced apart from one another; and the separating includes dicing the phosphor materials that fill the spaces between the adjacent light-emitting dies.

In some embodiments, the bonding is performed so that each light-emitting die is bonded to two of the respective conductive pads that are spaced apart from one another. In some embodiments, each light-emitting die includes a p-terminal and an n-terminal; the p-terminal is bonded to one of the conductive pads; and the n-terminal is bonded to the other one of the conductive pads.

In some embodiments, the method further includes: before the bonding, performing a binning process to a further plurality of light-emitting dies; and selecting, in response to results of the binding process, a subset of the further plurality of the light-emitting dies as the plurality of the light-emitting dies for bonding.

In some embodiments, the method further includes: fabricating a lighting module using one or more of the phosphor-coated light-emitting dies as its light source. In some embodiments, the fabricating the lighting module comprises: attaching the one or more of the phosphor-coated light-emitting dies to a substrate; applying a transparent and diffusive gel over the substrate and over the one or more phosphor-coated light-emitting dies; and installing a diffuser cap over the substrate, the diffuser cap housing the one or more phosphor-coated light-emitting dies and the transparent and diffusive gel within.

In some embodiments, the plurality of conductive pads are located on a submount, and wherein the separating includes dividing the submount into a plurality of submount pieces so that each phosphor-coated light-emitting die is attached to a respective submount piece.

In some embodiments, each of the conductive pads includes a lead frame.

In some embodiments, the plurality of conductive pads is attached to a substrate through a tape, and further comprising: removing the tape and the substrate before the separating.

In some embodiments, the light-emitting dies include light-emitting diodes (LEDs).

Another one of the broader forms of the present disclosure involves a method of packaging a light-emitting diode (LED). The method includes: providing a group of metal pads and a group of LEDs, wherein the metal pads include lead frames; attaching the group of LEDs to the group of metal pads, wherein each LED is spaced apart from adjacent LEDs after the attaching; coating a phosphor film around the group of LEDs collectively, wherein the phosphor film is coated on top and side surfaces of each LED and between adjacent LEDs; and performing a dicing process through portions of the phosphor film located between adjacent LEDs to divide the group of LEDs into a plurality of individual phosphor-coated LEDs.

In some embodiments, the attaching is performed so that each LED is attached to two of the respective metal pads that are physically separated from each other.

In some embodiments, for each LED: one of the two metal pads is attached to a p-terminal of the LED, and the other one of the two metal pads is attached to an n-terminal of the LED.

In some embodiments, the providing the group of LEDs includes: obtaining a plurality of LEDs; assigning the plurality of LEDs into different bins according to their performance characteristics; and choosing one or more bins of LEDs as the group of LEDs.

In some embodiments, the providing, the attaching, the coating, and the dicing are performed in a substrate-less manner.

In some embodiments, the LEDs are substantially evenly spaced apart after the attaching.

In some embodiments, the method further includes applying solder paste on the metal pads before the attaching Yet another one of the broader forms of the present disclosure involves a light-emitting diode (LED) lighting apparatus. The LED lighting apparatus includes: a substrate; a plurality of additional phosphor-coated LED chips that are located on the substrate, wherein the LED chips are physically separated from adjacent LED chips, and wherein each LED chip includes: an LED die; two conductive pads each bonded to the LED die; and a phosphor film coated conformally around the LED die, such that the LED die has the phosphor film coated on its top and side surfaces.

In some embodiments, the LED lighting apparatus further includes: a thermal dissipation structure thermally conductively coupled to the substrate; a diffuser cap located over the substrate and housing the LED chips underneath; and an optical gel disposed between the LED chips and the diffuser cap.

One aspect of the present disclosure involves a method. The method involves: providing a plurality of light-emitting dies disposed over a substrate; applying a phosphor material on the plurality of light-emitting dies; removing the substrate after the applying the phosphor material; and performing a dicing process to the plurality of light-emitting dies after the substrate has been removed.

In some embodiments, the method further includes: reusing the substrate for a future fabrication process.

In some embodiments, the method further includes: molding the phosphor material before the substrate has been removed so that a portion of the phosphor material disposed over each light-emitting die has a dome-like, curved, V or W shape.

In some embodiments, the substrate includes one of: a glass substrate, a silicon substrate, a ceramic substrate, and a gallium nitride substrate.

In some embodiments, the providing is performed such that an adhesive tape is disposed between the substrate and the plurality of light-emitting dies. In some embodiments, the method further includes: removing the tape; and attaching, after the substrate and the tape have been removed and before the dicing process is performed, a different tape to the plurality of light-emitting dies.

In some embodiments, the method further includes: curing the phosphor material before the substrate has been removed.

In some embodiments, the light-emitting dies include light-emitting diodes (LEDs) that have undergone a binning process.

In some embodiments, the method further includes, before the attaching: fabricating a lighting module with one or more of the light-emitting dies as its light source.

Another aspect of the present disclosure involves a method of packaging light-emitting diodes (LEDs). The method involves: attaching a tape to a plurality of LEDs, the tape being disposed on a substrate; coating a phosphor film around the plurality of LEDs; curing the phosphor film; removing the substrate after the curing; and singulating the LEDs after the substrate has been removed.

In some embodiments, the method further includes: recycling the substrate for a future LED packaging process.

In some embodiments, the method further includes: configuring, before the substrate has been removed, a shape of the phosphor film with a molding apparatus. In some embodiments, the configuring is performed so that the phosphor film is shaped to have a plurality of domes, and wherein the domes are disposed over the LEDs, respectively.

In some embodiments, the substrate includes one of: a glass substrate, a silicon substrate, a ceramic substrate, and a gallium nitride substrate.

In some embodiments, the method further includes: before the singulating the LEDs: removing the tape; replacing the removed tape with a different tape.

In some embodiments, the singulating comprises a mechanical die-saw process.

In some embodiments, the method further includes: performing a binning process to a group of LEDs; and thereafter selecting a subset of the group of LEDs as the plurality of LEDs to be attached to the tape.

Another aspect of the present disclosure involves a method of fabricating light-emitting diodes (LEDs). The method involves: providing a plurality of LEDs disposed over an adhesive tape, the tape being disposed on a substrate, wherein the substrate includes one of: a glass substrate, a silicon substrate, a ceramic substrate, and a gallium nitride substrate; coating a phosphor layer over the plurality of LEDs; curing the phosphor layer; removing the tape and the substrate after the curing; attaching a replacement tape to the plurality of LEDs; performing a dicing process to the plurality of LEDs after the substrate has been removed; and reusing the substrate for a future LED packaging process.

In some embodiments, the method further includes molding the phosphor layer such that the phosphor layer has a plurality of curved segments that are each disposed over a respective one of the LEDs.

In some embodiments, the providing comprises: selecting the plurality of LEDs from a group of LEDs that are associated with a plurality of bins, and wherein the plurality of LEDs selected all belong to a subset of the plurality of bins.

Yet another aspect of the present disclosure involves a method of packaging light-emitting diodes (LEDs). The method includes: attaching a tape to a plurality of LEDs, the tape being disposed on a substrate; coating a phosphor film around the plurality of LEDs; curing the phosphor film; removing the substrate after the curing; and singulating the LEDs after the substrate has been removed.

In some embodiments, the removing the substrate is performed in a manner such that the substrate can be recycled.

In some embodiments, the method includes: molding, before the substrate has been removed, a shape of the phosphor film with a molding stencil. In some embodiments, the molding is performed so that the phosphor film is shaped into a plurality of portions that each have one of the following shapes: a concave V-shape, a concave W-shape, and a concave U-shape, plurality of domes, and wherein each portion of the phosphor film is disposed over a different one of the LEDs, respectively. In some embodiments, the method may further include: forming a reflective layer over the phosphor film after the curing the phosphor film but before the removing the substrate. In some embodiments, the molding is performed so that the phosphor film is shaped into a plurality of portions that each have a convex dome-like shape, and wherein each portion of the phosphor film is disposed over a different one of the LEDs, respectively.

In some embodiments, the singulating further comprises: mechanically sawing an area between LEDs to separate the LEDs.

In some embodiments, the method further includes: binning a group of LEDs into a plurality of bins; and thereafter selecting LEDs in a subset of the plurality of bins as the plurality of LEDs to be attached to the tape.

Another aspect of the present disclosure involves a method of fabricating light-emitting diodes (LEDs). The method includes: providing a plurality of LEDs disposed over an adhesive tape, the tape being disposed on a substrate, wherein the substrate includes one of: a glass substrate, a silicon substrate, a ceramic substrate, and a gallium nitride substrate; coating a phosphor layer over the plurality of LEDs, the phosphor layer containing multiple sub-layers; curing the phosphor layer; forming a reflective layer over the phosphor layer; de-taping the tape after the forming of the reflective layer; removing the substrate after the forming of the reflective layer, the removing the substrate being performed in a manner such that the substrate is re-usable; attaching a replacement tape to the plurality of LEDs; and performing a dicing process to the plurality of LEDs after the substrate has been removed.

In some embodiments, one of the sub-layers of the phosphor layer contains a gel mixed with phosphor particles, and the other one of the sub-layers contains a gel mixed with diffuser particles.

In some embodiments, one of the sub-layers of the phosphor layer contains yellow phosphor particles mixed with a gel, and the other one of the sub-layers contains red phosphor particles mixed with a gel.

In some embodiments, the reflective layer contains silver or aluminum.

In some embodiments, the method further includes: molding the phosphor layer such that the phosphor layer has a plurality of predetermined segments that are each disposed over a respective one of the LEDs. In some embodiments, the predetermined segments each have one of: a concave V-shape, a concave U-shape, and a concave W-shape. In some embodiments, the predetermined segments each have a convex dome-like shape.

In some embodiments, the providing comprises: selecting the plurality of LEDs from a group of LEDs that are associated with a plurality of bins, and wherein the plurality of LEDs selected all belong to a subset of the plurality of bins.

Another aspect of the present disclosure involves a lighting apparatus. The lighting apparatus includes: a white light-emitting die that includes: a first-type semiconductor layer; a light emitting layer disposed over the first-type semiconductor layer; a second-type semiconductor layer disposed over the light emitting layer; two conductive terminals disposed on a surface of the second-type semiconductor layer away from the first-type semiconductor layer; and a phosphor film under which the first-type semiconductor layer, the light emitting layer, the second-type semiconductor layer, and the two conductive terminals are covered, wherein the phosphor film includes a first sub-layer and a second sub-layer disposed over the first sub-layer.

In some embodiments, the first sub-layer contains a gel mixed with phosphor particles, and the second sub-layer contains a gel mixed with diffuser particles.

In some embodiments, the first sub-layer contains yellow phosphor particles mixed with a gel, and the second sub-layer contains red phosphor particles mixed with a gel.

In some embodiments, the phosphor film has a convex dome-like shape.

In some embodiments, the phosphor film has one of the following shapes: a concave V-shape, a concave U-shape, or a concave W-shape. In some embodiments, the lighting apparatus further includes a reflective layer disposed over the phosphor film.

In some embodiments, a refractive index of the phosphor film is in a range from about 1.4 to about 2.0.

In some embodiments, the lighting apparatus further includes: a supporting member on which a plurality of the white light-emitting dies are located. In some embodiments, the lighting apparatus further includes a housing inside which the supporting member and the plurality of white light-emitting dies are located. In some embodiments, the housing is configured for one of: a light bulb, a light tube, a par light, and a down light. In some embodiments, the plurality of white light-emitting dies are arranged in a row. In some embodiments, the plurality of white light-emitting dies are arranged in matrix.

Another aspect of the present disclosure involves a lighting apparatus. The lighting apparatus includes a first doped semiconductor layer. A light-emitting layer is disposed over the first doped semiconductor layer. A second doped semiconductor layer is disposed over the light-emitting layer. The second doped semiconductor layer has a different type of conductivity than the first doped semiconductor layer. A photo-conversion layer is disposed over the second doped semiconductor layer and over side surfaces of the first and second doped semiconductor layers and the light-emitting layer. The photo-conversion layer has an angular profile.

Another aspect of the present disclosure involves a lighting apparatus. The lighting apparatus includes a light-emitting die. The light-emitting die includes: a first doped semiconductor layer; a light-emitting layer located over the first doped semiconductor layer; a second doped semiconductor layer located over the light-emitting layer, wherein the first and second doped semiconductor layers have different types of conductivity; and a first conductive terminal and a second conductive terminal each located below the first doped semiconductor layer. The phosphor layer is coated around the light-emitting die. The photo-conversion layer has one or more angular corners.

Another aspect of the present disclosure involves a lighting apparatus. The lighting apparatus includes a substrate. One or more light-emitting diode (LED) dies are disposed over the substrate. The LED dies each include: a first doped III-V compound layer; a multiple quantum well (MQW) layer disposed over the first doped III-V compound layer; a second doped III-V compound layer disposed over the MQW layer, wherein the first and second doped III-V compound layers have different types of conductivity. One or more phosphor coatings are each wrapped around a respective one of the one or more LED dies. The phosphor coatings each have one or more sharp corners that are defined by an upper surface and side surfaces of the phosphor coatings.

Another aspect of the present disclosure involves a lighting apparatus. The lighting apparatus includes a first doped semiconductor layer. A light-emitting layer is disposed over the first doped semiconductor layer. A second doped semiconductor layer is disposed over the light-emitting layer. The second doped semiconductor layer has a different type of conductivity than the first doped semiconductor layer. A first conductive terminal and a second conductive terminal are each disposed below the first doped semiconductor layer. A photo-conversion layer is disposed over the second doped semiconductor layer and on side surfaces of the first and second doped semiconductor layers and the light-emitting layer. A bottommost surface of the photo-conversion layer is located closer to the second doped semiconductor layer than bottom surfaces of the first and second conductive terminals.

Another aspect of the present disclosure involves a lighting apparatus. The lighting apparatus includes a light-emitting die. The light-emitted die includes a first doped semiconductor layer. A light-emitting layer is located over the first doped semiconductor layer. A second doped semiconductor layer is located over the light-emitting layer. The first and second doped semiconductor layers have different types of conductivity. A first conductive terminal and a second conductive terminal are each located below the first doped semiconductor layer. A phosphor layer is coated over an upper surface and side surfaces of the light-emitting die. A bottommost surface of the phosphor layer is located above a bottommost surface of the first and second conductive terminals.

Another aspect of the present disclosure involves a lighting apparatus. The lighting apparatus includes a substrate. One or more light-emitting diode (LED) dies are disposed over an upper surface of the substrate. The LED dies each include: a first doped III-V compound layer; a multiple quantum well (MQW) layer disposed over the first doped III-V compound layer; a second doped III-V compound layer disposed over the MQW layer, wherein the first and second doped III-V compound layers have different types of conductivity; a first metal pad that is electrically coupled to the first doped III-V compound layer; and a second metal pad that is electrically coupled to the second doped III-V compound layer, wherein the first and second metal pads are disposed on an upper surface of the substrate. One or more phosphor layers are each coated over an upper surface and side surfaces of a respective one of the one or more LED dies. The upper surface of the substrate and bottommost surfaces of the one or more phosphor layers define a plurality of gaps that are each in a range from about 0.1 micron to about 50 microns.

Yet another aspect of the present disclosure involves a lighting apparatus. The lighting apparatus includes a light-emitting device. The light-emitting device includes a first doped semiconductor layer. A light-emitting layer is disposed over the first doped semiconductor layer. A second doped semiconductor layer is disposed over the light-emitting layer. The second doped semiconductor layer have a different type of conductivity than the first doped semiconductor layer. A photo-conversion layer is coated around the light-emitting device. A lens houses the light-emitting device and the phosphor-conversion layer within. The lens includes a first sub-layer and a second sub-layer. The first and second sub-layers have different characteristics.

Yet another aspect of the present disclosure involves a lighting apparatus. The lighting apparatus includes a light-emitting diode (LED) chip. The LED chip includes a first doped semiconductor layer. A light-emitting layer is located over the first doped semiconductor layer. A second doped semiconductor layer is located over the light-emitting layer. The first and second doped semiconductor layers have different types of conductivity. A phosphor film is coated around the LED chip. A lens covers the LED chip and the phosphor film. The lens has a transmittance greater than about 90% and a refractive index between about 1.4 and about 2. The lens includes a plurality of sub-layers. The sub-layers have different material compositions.

Yet another aspect of the present disclosure involves a lighting apparatus. The lighting apparatus includes a substrate. The substrate is a printed circuit board substrate, ceramic substrate, or a copper substrate. A plurality of phosphor-coated light-emitting diode (LED) dies are disposed over the substrate. The phosphor-coated LED dies each include: a first doped III-V compound layer; a multiple quantum well (MQW) layer disposed over the first doped III-V compound layer; a second doped III-V compound layer disposed over the MQW layer, wherein the first and second doped III-V compound layers have different types of conductivity; and a phosphor film coated on each of the LED dies. The lighting apparatus includes a plurality of molded lenses that each house a respective one of the phosphor-coated LED dies within. The molded lenses each have a transmittance greater than about 90% and a refractive index between about 1.4 and about 2. The molded lenses each include a plurality of sub-layers. The sub-layers each contain particles having different characteristics.

Yet another aspect of the present disclosure involves a method. The method includes providing a substrate having a layer disposed thereon. A plurality of light-emitting devices is attached to the layer. A gel is applied over the substrate, the gel covering the plurality of light-emitting devices. The gel is shaped into a plurality of lenses. The lenses each cover a respective one of the light-emitting devices. The light-emitting devices are separated from one another. The substrate and the layer are removed.

Yet another aspect of the present disclosure involves a method. The method includes forming a layer on a substrate. The layer is an adhesive layer, or a photoresist layer, or a tape. A plurality of light-emitting diodes (LEDs) is attached to the substrate through the layer. The LEDs are each coated with a phosphor film. A gel is applied over the substrate, the gel covering the plurality of LEDs. The gel is molded into a plurality of lenses. The lenses each house a respective one of the LEDs therein. The plurality of LEDs are singulated. The substrate and the layer are removed.

Yet another aspect of the present disclosure involves a method. The method includes providing a substrate with a tape disposed thereon. A plurality of phosphor-coated light-emitting diode (LED) dies is attached to the tape. A gel is applied over the substrate. The gel covers the plurality of LED dies. The gel is molded into a plurality of lenses. The lenses each house a respective one of the LED dies underneath. The plurality of LED dies is singulated. The tape and the substrate are removed. The singulated LED dies are bonded to a printed circuit board.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a substrate having a layer disposed thereon;
   attaching a plurality of light-emitting devices to the layer;
   applying a gel over the substrate, the gel covering the plurality of light-emitting devices;
   shaping the gel into a plurality of lenses, wherein the lenses each cover a respective one of the light-emitting devices, wherein the lenses each include a first sub-layer and a second sub-layer, and wherein the first and second sub-layers have different characteristics;
   separating the light-emitting devices from one another; and
   removing the substrate and the layer.

2. The method of claim 1, wherein the providing of the layer comprises placing a tape on the substrate.

3. The method of claim 1, wherein the providing of the layer includes forming a photoresist material on the substrate.

4. The method of claim 1, wherein the providing of the layer comprises forming an adhesive layer on the substrate.

5. The method of claim 1, further comprising, before the attaching of the plurality of light-emitting devices, coating a phosphor layer on the light-emitting devices.

6. The method of claim 1, further comprising: bonding the separated light-emitting devices to a printed circuit board.

7. The method of claim 1, wherein:
the first sub-layer contains phosphor particles; and
the second sub-layer contains diffuser particles.

8. The method of claim 1, wherein:
the first sub-layer contains first phosphor particles;
the second sub-layer contains second phosphor particles; and
the first and second phosphor particles are different color phosphor particles.

9. The method of claim 1, wherein the separating of the light-emitting devices is performed before the removing of the substrate.

10. The method of claim 1, wherein the separating of the light-emitting devices is performed after the removing of the substrate.

11. A method, comprising:
forming a layer on a substrate, the layer being an adhesive layer, or a photoresist layer, or a tape;
attaching a plurality of light-emitting diodes (LEDs) to the substrate through the layer, the LEDs each being coated with a phosphor film;
applying a gel over the substrate, the gel covering the plurality of LEDs;
molding the gel into a plurality of lenses, wherein the lenses each house a respective one of the LEDs therein, and wherein the lenses each have a non-flat upper surface;
singulating the plurality of LEDs; and
removing the substrate and the layer.

12. The method of claim 11, further comprising: bonding the singulated LEDs to a printed circuit board.

13. The method of claim 11, wherein the applying of the gel and the molding of the gel are performed such that:
the lenses each includes a first sub-layer and a second sub-layer; and
the first and second sub-layers have different material compositions.

14. The method of claim 13, wherein:
the first sub-layer contains phosphor particles but not diffuser particles; and
the second sub-layer contains diffuser particles but not phosphor particles.

15. The method of claim 13, wherein:
the first sub-layer contains first phosphor particles;
the second sub-layer contains second phosphor particles; and
the first and second phosphor particles are different color phosphor particles.

16. The method of claim 11, wherein the singulating of the LEDs is performed before the removing of the substrate.

17. A method, comprising:
providing a substrate with a tape disposed thereon, wherein the tape contains an adhesive material;
attaching a plurality of phosphor-coated light-emitting diode (LED) dies to the tape;
applying a gel over the substrate, the gel covering the plurality of LED dies;
molding the gel into a plurality of lenses, wherein the lenses each house a respective one of the LED dies underneath, and wherein the lenses each have a non-flat upper surface;
singulating the plurality of LED dies;
removing the tape and the substrate; and
bonding the singulated LED dies to a printed circuit board.

18. The method of claim 17, wherein the applying of the gel and the molding of the gel are performed such that:
the lenses each includes a first sub-layer and a second sub-layer;
the first sub-layer contains phosphor particles but not diffuser particles; and
the second sub-layer contains diffuser particles but not phosphor particles.

19. The method of claim 17, wherein the applying of the gel and the molding of the gel are performed such that:
the lenses each includes a first sub-layer and a second sub-layer;
the first sub-layer contains yellow phosphor particles; and
the second sub-layer contains red phosphor particles.

20. The method of claim 17, wherein the adhesive material contains photoresist.

* * * * *